(12) United States Patent
Lin et al.

(10) Patent No.: US 11,444,177 B2
(45) Date of Patent: Sep. 13, 2022

(54) SEMICONDUCTOR DEVICE AND METHOD

(71) Applicant: Taiwan Semiconductor Manufacturing Co., Ltd., Hsinchu (TW)

(72) Inventors: Wen-Kai Lin, Yilan County (TW); Che-Hao Chang, Hsinchu (TW); Chi On Chui, Hsinchu (TW); Yung-Cheng Lu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/940,226

(22) Filed: Jul. 27, 2020

(65) Prior Publication Data

US 2021/0242327 A1 Aug. 5, 2021

Related U.S. Application Data

(60) Provisional application No. 62/967,933, filed on Jan. 30, 2020.

(51) Int. Cl.
*H01L 29/66* (2006.01)
*H01L 27/088* (2006.01)
(Continued)

(52) U.S. Cl.
CPC ........ *H01L 29/66553* (2013.01); *H01L 21/823431* (2013.01); *H01L 27/0886* (2013.01);
(Continued)

(58) Field of Classification Search
CPC ......... H01L 21/8234; H01L 21/823431; H01L 21/823487; H01L 21/8238;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

| KR | 20160059861 A | 5/2016 |
| KR | 20190002005 A | 1/2019 |
| KR | 20190024535 A | 3/2019 |

*Primary Examiner* — Cheung Lee
(74) *Attorney, Agent, or Firm* — Slater Matsil, LLP

(57) ABSTRACT

Improved inner spacers for semiconductor devices and methods of forming the same are disclosed. In an embodiment, a semiconductor device includes a substrate; a plurality of semiconductor channel structures over the substrate; a gate structure over the semiconductor channel structures, the gate structure extending between adjacent ones of the semiconductor channel structures; a source/drain region adjacent of the gate structure, the source/drain region contacting the semiconductor channel structures; and an inner spacer interposed between the source/drain region and the gate structure, the inner spacer including a first inner spacer layer contacting the gate structure and the source/drain region, the first inner spacer layer including silicon and nitrogen; and a second inner spacer layer contacting the first inner spacer layer and the source/drain region, the second inner spacer layer including silicon, oxygen, and nitrogen, the second inner spacer layer having a lower dielectric constant than the first inner spacer layer.

20 Claims, 35 Drawing Sheets

(51) Int. Cl.
*H01L 29/423* (2006.01)
*H01L 21/8234* (2006.01)
*H01L 29/786* (2006.01)

(52) U.S. Cl.
CPC .... *H01L 29/42392* (2013.01); *H01L 29/6653* (2013.01); *H01L 29/6656* (2013.01); *H01L 29/78696* (2013.01)

(58) Field of Classification Search
CPC ..... H01L 21/823821; H01L 21/823885; H01L 27/088; H01L 21/0886; H01L 21/092; H01L 21/0922; H01L 21/0924; H01L 29/413; H01L 29/4232; H01L 29/42392; H01L 29/66007; H01L 29/66477; H01L 29/6653; H01L 29/66545; H01L 29/66553; H01L 29/6656; H01L 29/78; H01L 29/785; H01L 29/786; H01L 29/78696; H01L 27/0886
See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2016/0141381 | A1 | 5/2016 | Kim et al. |
| 2019/0006485 | A1* | 1/2019 | Kim .......... H01L 29/66439 |
| 2019/0067441 | A1 | 2/2019 | Yang et al. |
| 2019/0198639 | A1* | 6/2019 | Kim .......... H01L 29/66795 |
| 2020/0287021 | A1* | 9/2020 | Wu .......... H01L 29/42392 |

\* cited by examiner

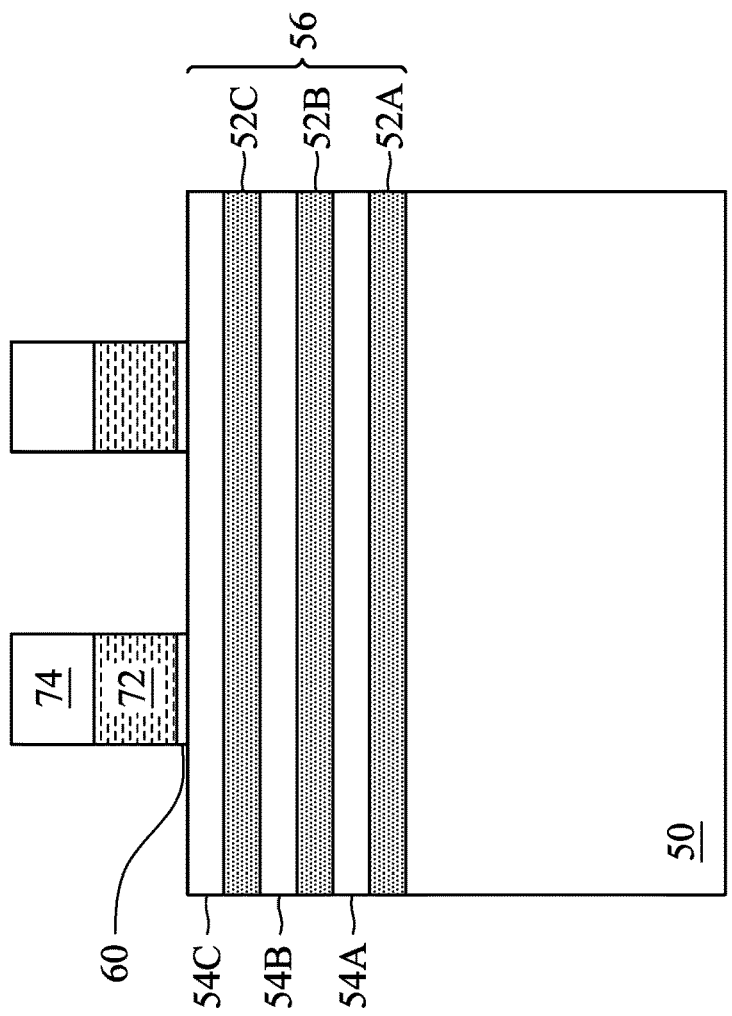
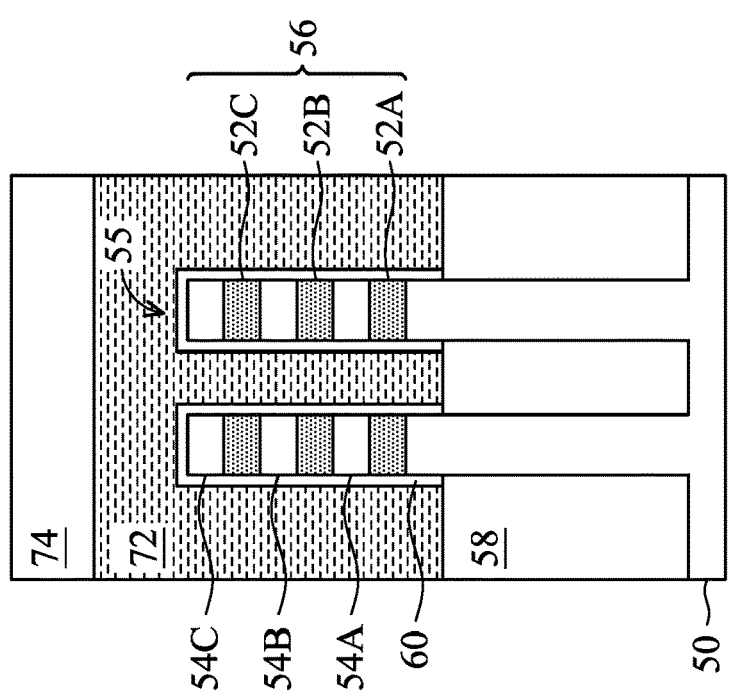
Figure 6A
Figure 6B

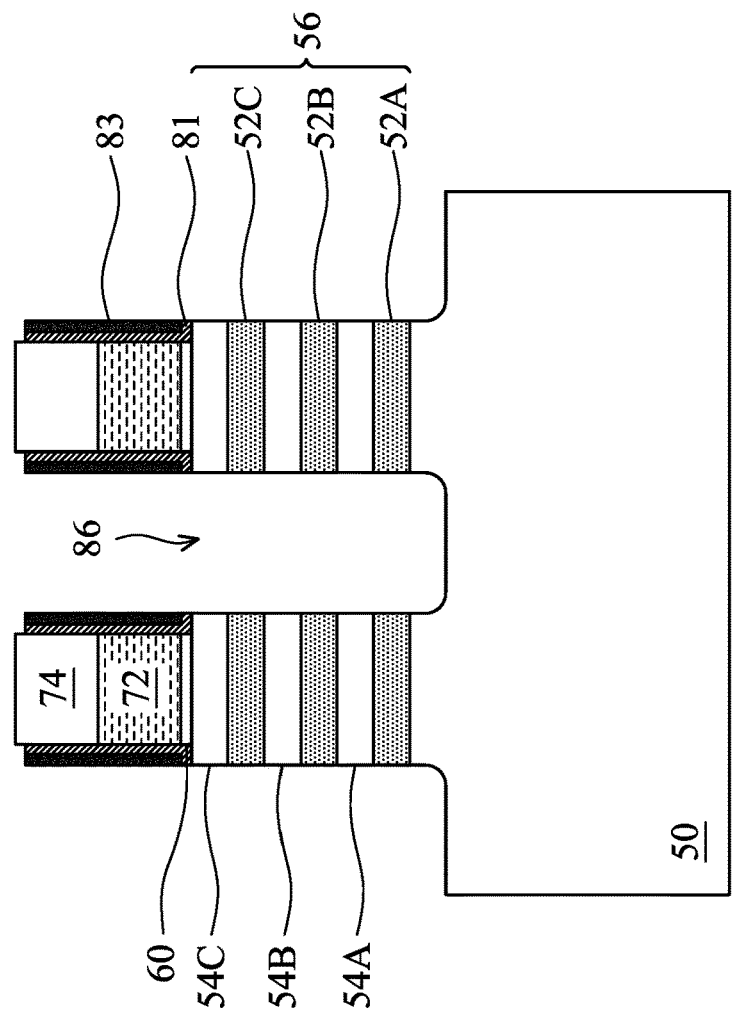
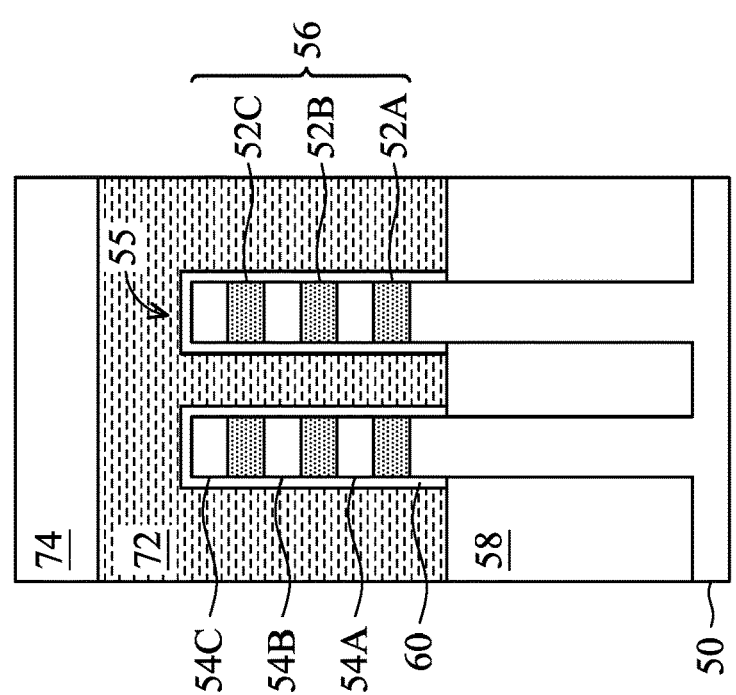
Figure 9B
Figure 9A

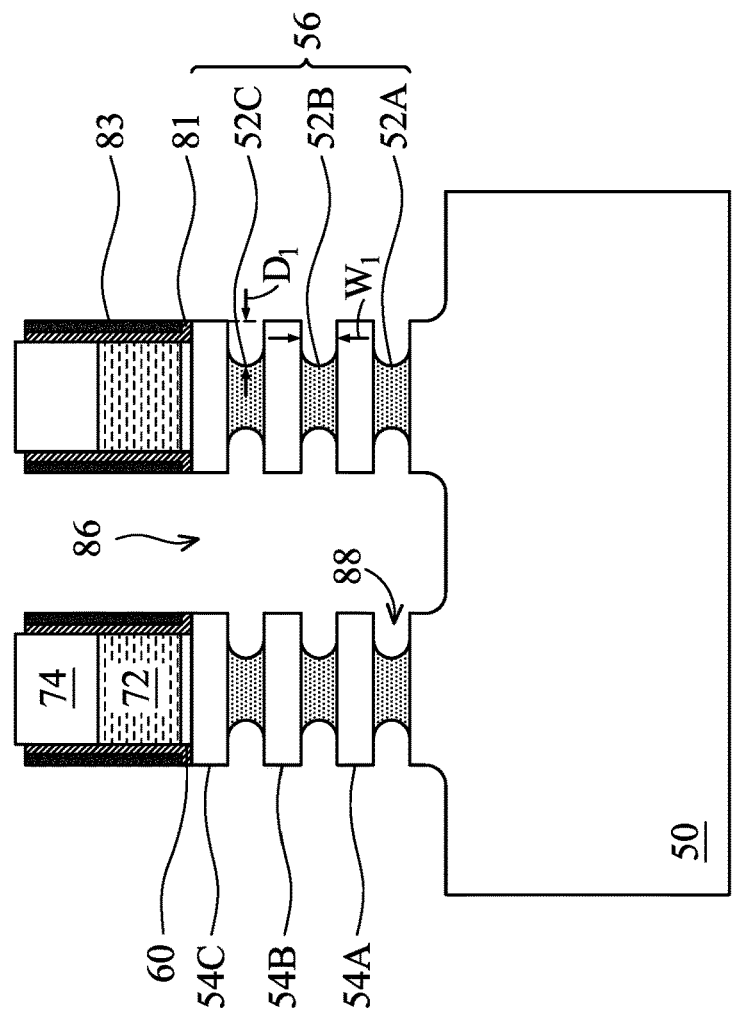
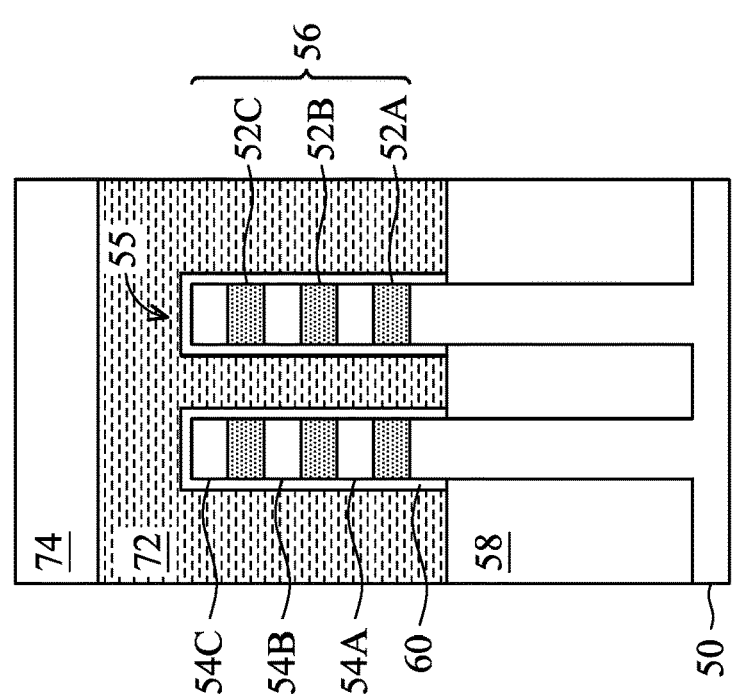
Figure 10B
Figure 10A

SEMICONDUCTOR DEVICE AND METHOD

PRIORITY CLAIM AND CROSS-REFERENCE

This application claims the benefit of U.S. Provisional Application No. 62/967,933, filed Jan. 30, 2020 and entitled "Semiconductor Device and Method," which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C, 8A, 8B, 8C, 9A, 9B, 9C, 10A, 10B, 10C, 11A, 11B, 11C, 12A, 12B, 12C, 12D, 13A, 13B, 13C, 13D, 14A, 14B, 14C, 15A, 15B, 15C, 16A, 16B, 16C, 17A, 17B, 17C, 18A, 18B, 18C, 18D, 19A, 19B, 19C, 20A, 20B, and 20C are cross-sectional views of intermediate stages in the manufacturing of semiconductor devices, in accordance with some embodiments.

DETAILED DESCRIPTION

Figure 1:
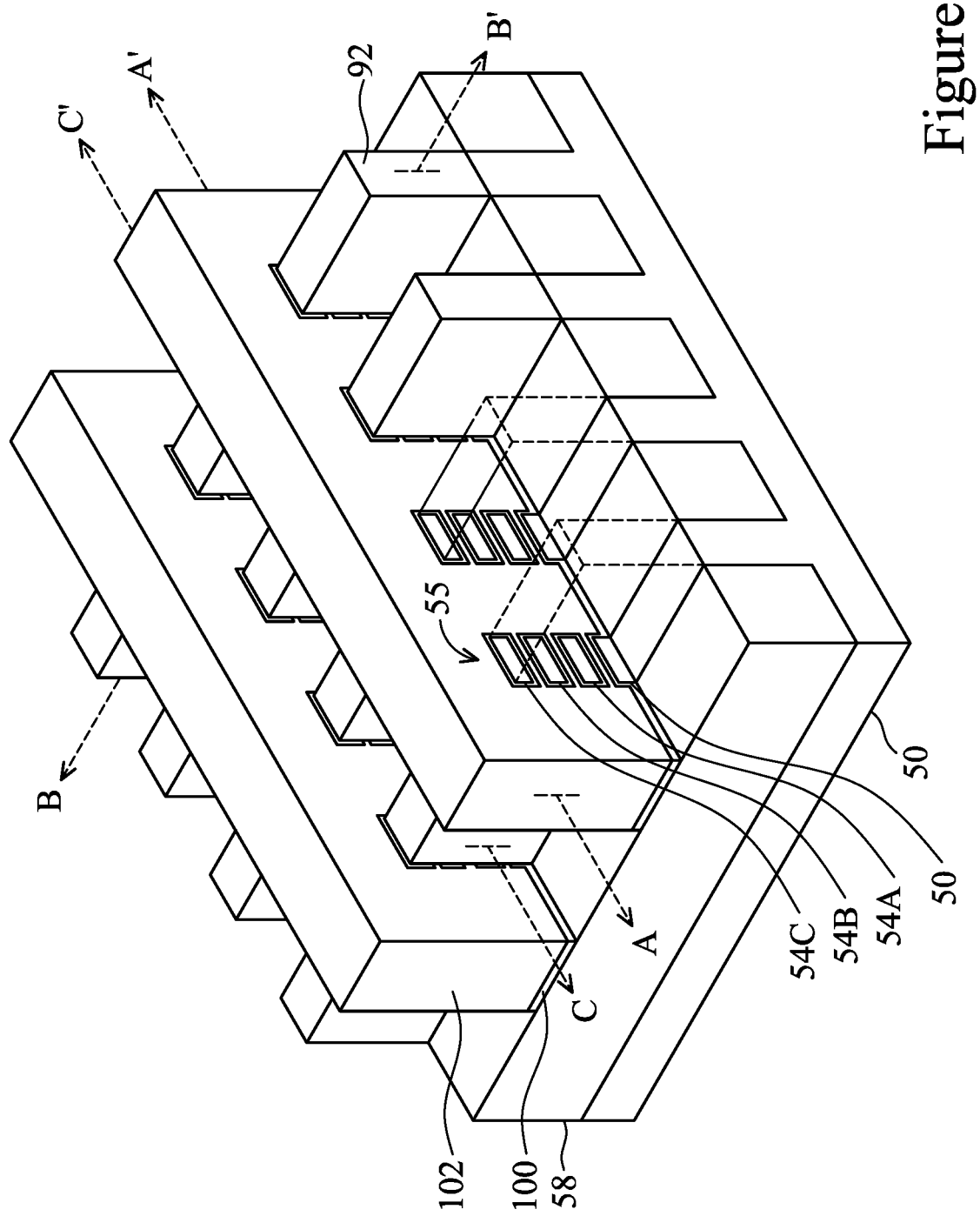
FIG. 1 illustrates an example of a semiconductor device including nanostructure field-effect transistors (NSFETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods of forming improved inner spacers in semiconductor devices and semiconductor devices formed by said methods. The inner spacers may be used to isolate gate stacks from source/drain regions. The inner spacers may be formed by depositing multiple dielectric layers having different compositions. For example, in some embodiments, the inner spacers may be formed of three dielectric layers having different etch selectivities and dielectric constants (k-values). The inner spacers may be formed by depositing a first dielectric layer having a high etch selectivity, then depositing a second dielectric layer having a low k-value over the first dielectric layer, then depositing a third dielectric layer having a low k-value over the second dielectric layer. In some embodiments, the first dielectric layer may comprise silicon carbonitride (SiCN) and the second dielectric layer and the third dielectric layer may comprise silicon oxycarbonitride (SiOCN). Including the first dielectric layer, which has a high etch selectivity, in the inner spacers improves the etch resistance of the inner spacers and improves the profiles of the inner spacers. Including the second dielectric layer and the third dielectric layer in the inner spacers reduces the effective capacitance ($C_{eff}$) of semiconductor devices including the inner spacers and results in improved device performance.

FIG. 1 illustrates an example of nanostructure (e.g., nanosheet, nanowire, gate-all-around, or the like) field effect transistors (NSFETs), in accordance with some embodiments. The NSFETs comprise nanostructures 55 over a substrate 50 (e.g., a semiconductor substrate). The nanostructures 55 include second semiconductor layers 54A-54C, which act as channel regions of the nanostructures 55. Shallow trench isolation (STI) regions 58 are disposed in the substrate 50, and the nanostructures 55 are disposed above and between neighboring STI regions 58. Although the STI regions 58 are described/illustrated as being separate from the substrate 50, as used herein, the term "substrate" may refer to the semiconductor substrate alone or a combination of the semiconductor substrate and the STI regions.

Gate dielectric layers 100 are along top surfaces, sidewalls, and bottom surfaces of the nanostructures 55, such as on top surfaces, sidewalls, and bottom surfaces of each of the second semiconductor layers 54A-54C, and along top surfaces and sidewalls of portions of the substrate 50. Gate electrodes 102 are over the gate dielectric layers 100. Epitaxial source/drain regions 92 are disposed on opposite sides of the nanostructures 55, the gate dielectric layers 100, and the gate electrodes 102. FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of the NSFETs. Cross-section B-B' is perpendicular to cross-section A-A' and is along a longitudinal axis of a nanostructure 55 and in a direction of, for example, the current flow between the epitaxial source/drain regions 92 of the NSFETs. Cross-section C-C' is parallel to cross-section A-A' and extends through the epitaxial source/drain regions 92 of the NSFETs. Subsequent figures refer to these reference cross-sections for clarity.

Some embodiments discussed herein are discussed in the context of NSFETs formed using gate-last processes. In other embodiments, a gate-first process may be used. Also, some embodiments contemplate aspects used in fin field effect transistors (FinFETs) or planar devices, such as planar FETs.

FIGS. 2 through 20C are cross-sectional views of intermediate stages in the manufacturing of NSFETs, in accordance with some embodiments. FIGS. 2 through 5, 6A, 7A, 8A, 9A, 10A, 11A, 12A, 13A, 14A, 15A, 16A, 17A, 18A, 18D, 19A, and 20A illustrate reference cross-section A-A' illustrated in FIG. 1. FIGS. 6B, 7B, 8B, 9B, 10B, 11B, 12B, 12D, 13B, 14B, 15B, 16B, 17B, 18B, 18C, 19B, and 20B illustrate reference cross-section B-B' illustrated in FIG. 1. FIGS. 6C, 7C, 8C, 9C, 10C, 11C, 12C, 13C, 13D, 14C, 15C, 16C, 17C, 18C, 19C, and 20C illustrate reference cross-section C-C' illustrated in FIG. 1.

Figure 2:
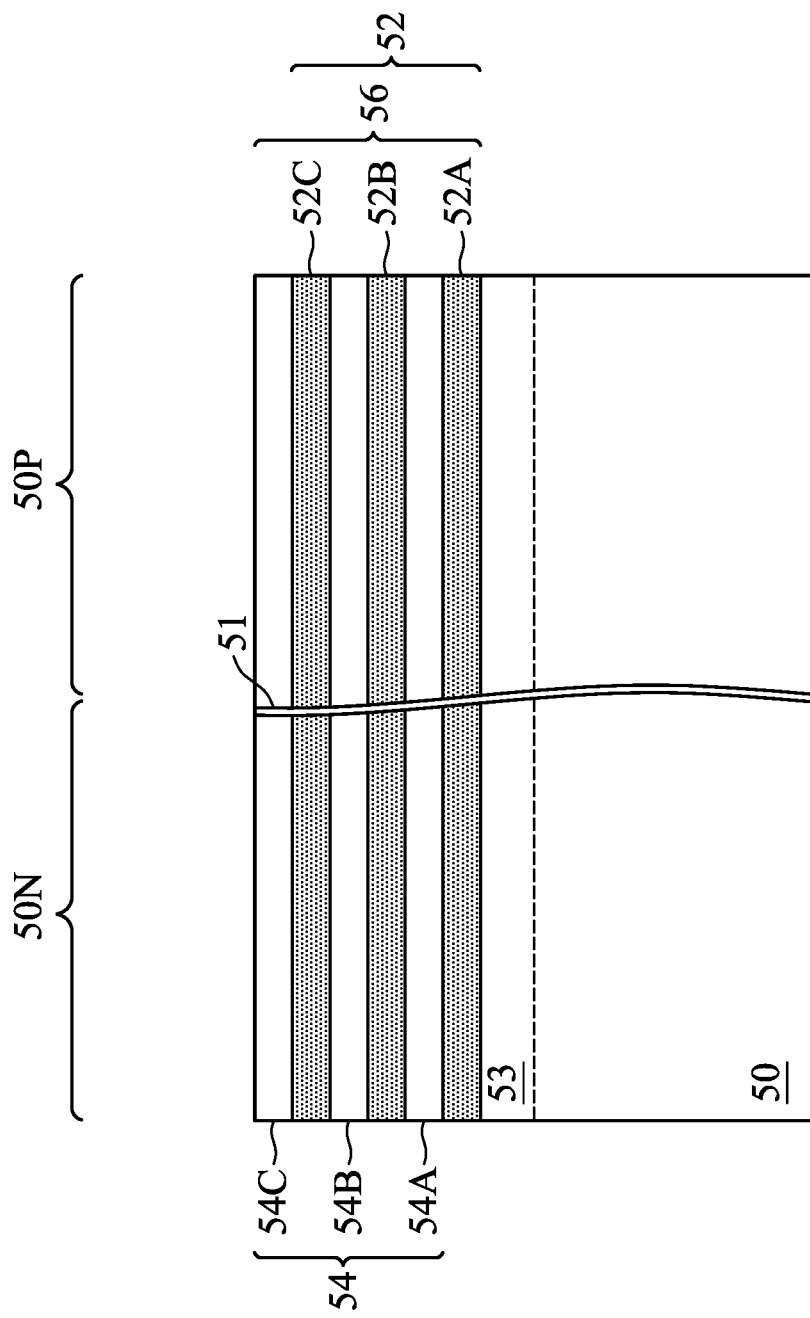

In FIG. 2, a substrate 50 is provided for forming NSFETs. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type NSFETs. The region 50P can be for forming p-type devices, such as PMOS transistors, e.g., p-type NSFETs. The region 50N may be physically separated from the region 50P (as illustrated by divider 51), and any number of device features (e.g., other active devices, doped regions, isolation structures, etc.) may be disposed between the region 50N and the region 50P.

Appropriate wells (not separately illustrated) may be formed in the region 50N and the region 50P of the substrate 50. In some embodiments, P wells may be formed in the region 50N, and N wells may be formed in the region 50P. In some embodiments, P wells or N wells may be formed in each of the region 50N and the region 50P.

In embodiments including different well types, different implant steps for the region 50N and the region 50P may be achieved using a photoresist or other masks (not separately illustrated). For example, a photoresist may be formed over the substrate 50 in the region 50N. The photoresist is patterned to expose the region 50P of the substrate 50. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N. The n-type impurities may be phosphorus, arsenic, antimony, or the like implanted in the region to a concentration of equal to or less than $1\times10^{18}$ atoms/cm$^3$, such as from about $1\times10^{16}$ atoms/cm$^3$ to about $1\times10^{18}$ atoms/cm$^3$. After the implant, the photoresist is removed, such as by an acceptable ashing process.

Following the implanting of the region 50P, a photoresist is formed over the substrate 50 in the region 50P. The photoresist is patterned to expose the region 50N of the substrate 50. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P. The p-type impurities may be boron, boron fluoride, indium, or the like implanted in the region to a concentration of equal to or less than $1\times10^{18}$ atoms/cm$^3$, such as from about $1\times10^{16}$ atoms/cm$^3$ to about $1\times10^{18}$ atoms/cm$^3$. After the implant, the photoresist may be removed, such as by an acceptable ashing process.

An anti-punch-through (APT) implantation may be performed on an upper portion of the substrate 50 to form an APT region 53. During the APT implantation, dopants may be implanted in the region 50N and the region 50P. The dopants may have a conductivity type opposite a conductivity type of source/drain regions (such as the epitaxial source/drain regions 92, discussed below with respect to FIGS. 13A-13D) to be formed in each of the region 50N and the region 50P. The APT region 53 may extend under the subsequently formed source/drain regions in the resulting NSFETs, which will be formed in subsequent processes. The APT region 53 may be used to reduce the leakage from the source/drain regions to the substrate 50. In some embodiments, the doping concentration in APT region 53 may be from about $1\times10^{18}$ atoms/cm$^3$ to about $1\times10^{19}$ atoms/cm$^3$. For simplicity and legibility, the APT region 53 is not illustrated in subsequent drawings. After the implants of the region 50N and the region 50P (including the formation of the wells and/or the APT region 53), an anneal may be performed to repair implant damage and to activate the p-type and/or n-type impurities that were implanted.

Further in FIG. 2, a multi-layer stack 56 is formed over the substrate 50. The multi-layer stack 56 includes alternating first semiconductor layers 52 and second semiconductor layers 54 of different semiconductor materials. The first semiconductor layers 52 may be formed of first semiconductor materials, which may include, for example, silicon germanium (SiGe) or the like. The second semiconductor layers 54 may be formed of second semiconductor materials, which may include, for example, silicon (Si), silicon carbon (SiC), or the like. In some embodiments, the first semiconductor layers 52 may be formed of the second semiconductor materials and the second semiconductor layers 54 may be formed of the first semiconductor materials. For purposes of illustration, the multi-layer stack 56 includes three of the first semiconductor layers 52 (e.g., first semiconductor layers 52A-52C) and three of the second semiconductor layers 54 (e.g., second semiconductor layers 54A-54C). In some embodiments, the multi-layer stack may include between two and four pairs of the first semiconductor layers 52 and the second semiconductor layers 54. In some embodiments, the multi-layer stack 56 may include any number of the first semiconductor layers 52 and the second semiconductor layers 54. Each of the layers of the multi-layer stack 56 may be epitaxially grown using a process such as chemical vapor deposition (CVD), atomic layer deposition (ALD), vapor phase epitaxy (VPE), molecular beam epitaxy (MBE), or the like. Each of the first semiconductor layers 52A-52C may have a thickness from about 8 nm to about 12 nm or from about 9.5 nm to about 10.5 nm. Each of the second semiconductor layers 54A-54C may have a thickness from about 5 nm to about 15 nm or from about 8 nm to about 12 nm.

For purposes of illustration, the second semiconductor layers 54 will be described as forming channel regions in the region 50N and the region 50P. The first semiconductor layers 52 may be sacrificial layers in the region 50N and the region 50P, which may be subsequently removed. In some embodiments, the first semiconductor layers 52 may form channel regions and the second semiconductor layers 54 may be sacrificial layers in the region 50N and the region 50P. In some embodiments, the second semiconductor layers 54 may form channel regions in the region 50N and sacrificial layers in the region 50P and the first semiconductor layers 52 may form sacrificial layers in the region 50N and channel regions in the region 50P or the first semiconductor layers 52 may form channel regions in the region 50N and sacrificial layers in the region 50P and the second semiconductor layers 54 may form sacrificial layers in the region 50N and channel regions in the region 50P.

Figure 3:
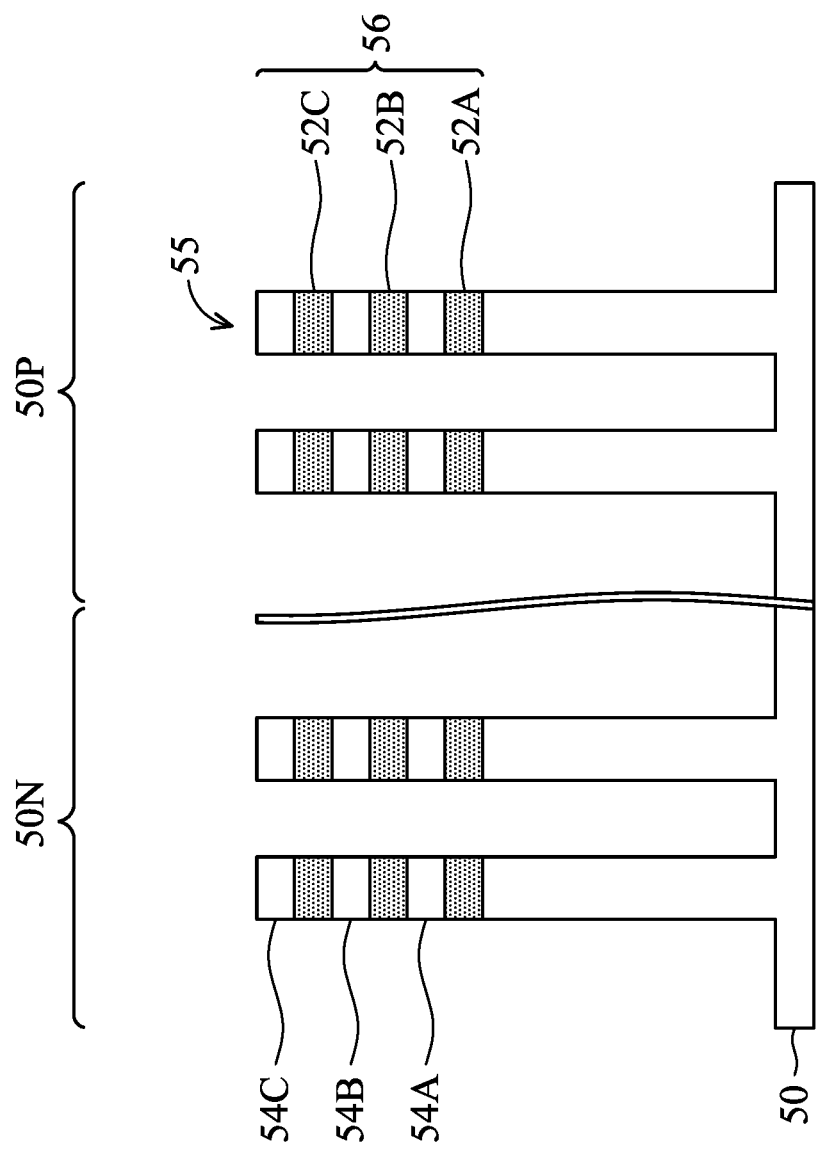

In FIG. 3, nanostructures 55 are formed in the multi-layer stack 56 and the substrate 50 is etched. In some embodiments, the nanostructures 55 may be formed by etching trenches in the multi-layer stack 56 and the substrate 50. The etching may be any acceptable etch process, such as a reactive ion etch (RIE), neutral beam etch (NBE), the like, or a combination thereof. The etching may be anisotropic.

The nanostructures 55 and the substrate 50 may be patterned by any suitable method. For example, the nanostructures 55 and the substrate 50 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures 55 and the substrate 50. In some embodiments, a mask (or other layer) may remain on the nanostructures 55 after patterning the nanostructures 55 and the substrate 50.

Figure 4:
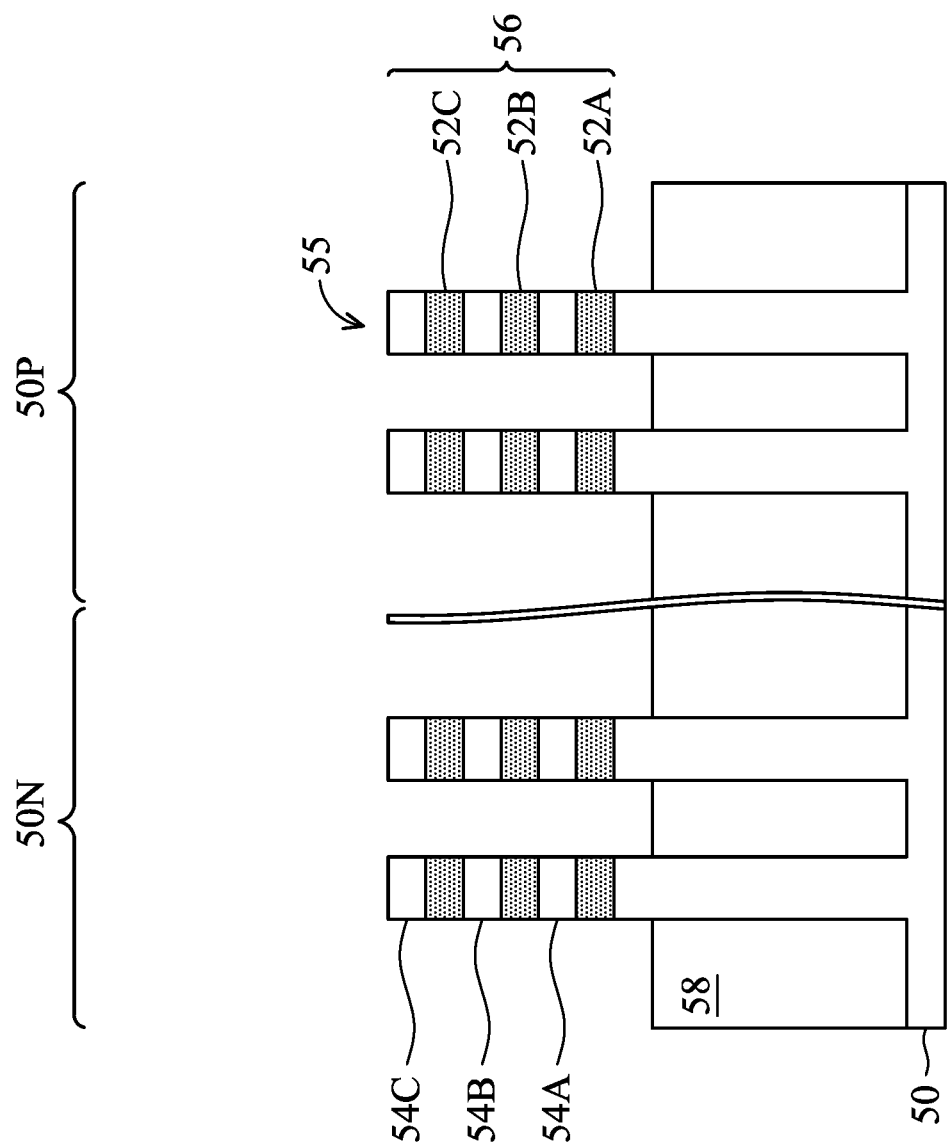

In FIG. 4, shallow trench isolation (STI) regions 58 are formed adjacent the nanostructures 55 and the patterned portions of the substrate 50. The STI regions 58 may be formed by forming an insulation material (not separately illustrated) over the substrate 50 and between neighboring nanostructures 55/patterned portions of the substrate 50. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In some embodiments, the insulation material is silicon oxide formed by an FCVD process. An anneal process may be performed once the insulation material is formed. In some embodiments, the insulation material is formed such that excess insulation material covers the nanostructures 55. The insulation material may comprise a single layer or may utilize multiple layers. For example, in some embodiments a liner (not separately illustrated) may first be formed along surfaces of the substrate 50 and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process may planarize the insulation material and the nanostructures 55. The planarization process exposes the nanostructures 55 such that top surfaces of the nanostructures 55 and the insulation material are level after the planarization process is complete.

The insulation material is then recessed to form the STI regions 58 as illustrated in FIG. 4. The insulation material is recessed such that upper portions of the nanostructures 55 and the substrate 50 protrude from between neighboring STI regions 58. Further, the top surfaces of the STI regions 58 may have flat surfaces as illustrated, convex surfaces, concave surfaces (such as dishing), or a combination thereof. The top surfaces of the STI regions 58 may be formed flat, convex, and/or concave by an appropriate etch. The STI regions 58 may be recessed using an acceptable etching process, such as one that is selective to the material of the insulation material (e.g., etches the material of the insulation material at a faster rate than the material of the nanostructures 55 and the substrate 50). For example, an oxide removal using, for example, dilute hydrofluoric (dHF) acid may be used.

The process described with respect to FIGS. 2-4 is just one example of how to form the nanostructures 55. In some embodiments, the nanostructures 55 may be formed by epitaxial growth processes. For example, dielectric layers may be formed over top surfaces of the substrate 50, and trenches may be etched through the dielectric layers to expose the underlying substrate 50. Epitaxial structures may be epitaxially grown in the trenches, and the dielectric layers may be recessed such that the epitaxial structures protrude from the dielectric layer to form the nanostructures 55. In the nanostructures 55, the epitaxial structures may comprise alternating layers of the first semiconductor materials and the second semiconductor materials. The dielectric layers may be subsequently recessed such that the nanostructures 55 and portions of the substrate 50 protrude from the dielectric layer. In embodiments where the nanostructures 55 and portions of the substrate 50 are epitaxially grown, the epitaxially grown materials may be in situ doped during growth, which may obviate prior and subsequent implantations, although in situ and implantation doping may be used together.

Figure 5:
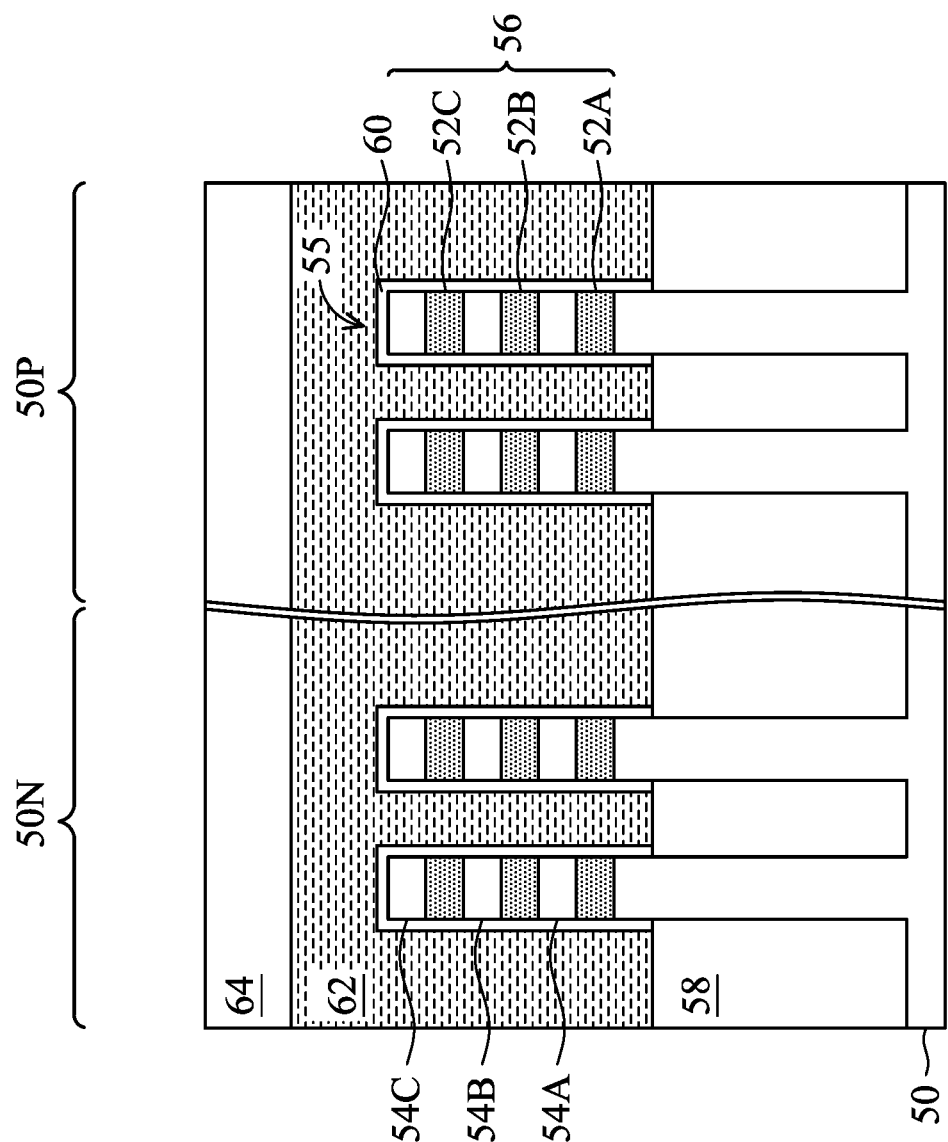

In FIG. 5, dummy dielectric layers 60 are formed on the nanostructures 55 and portions of the substrate 50 extending above the STI regions 58 (if any). The dummy dielectric layers 60 may be, for example, silicon oxide, silicon nitride, a combination thereof, or the like, and may be deposited or thermally grown according to acceptable techniques. A dummy gate layer 62 is formed over the dummy dielectric layers 60, and a mask layer 64 is formed over the dummy gate layer 62. The dummy gate layer 62 may be deposited over the dummy dielectric layers 60 and then planarized by a process such as CMP. The mask layer 64 may be deposited over the dummy gate layer 62. The dummy gate layer 62 may be conductive or non-conductive materials and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the material of the STI regions 58. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layers 60 are shown covering only the nanostructures 55 and the substrate 50 for illustrative purposes only. In some embodiments, the dummy dielectric layers 60 may be deposited such that the dummy dielectric layers 60 cover the STI regions 58, extending between the dummy gate layer 62 and the STI regions 58.

FIGS. 6A through 20C illustrate various additional steps in the manufacturing of embodiment devices. FIGS. 6A through 20C illustrate features in either of the region 50N or the region 50P. For example, the structures illustrated in FIGS. 6A through 20C may be applicable to both the region 50N and the region 50P. Differences (if any) in the structures of the region 50N and the region 50P are described in the text accompanying each figure.

Figure 6C:
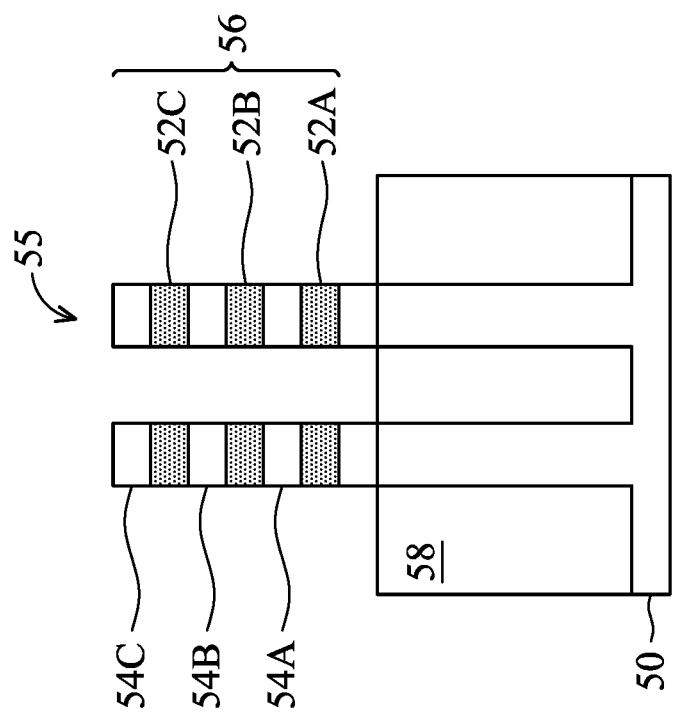

In FIGS. 6A through 6C, the mask layer 64 (see FIG. 5) may be patterned using acceptable photolithography and etching techniques to form masks 74. An acceptable etching technique may be used to transfer the pattern of the masks 74 to the dummy gate layer 62 to form dummy gates 72. In some embodiments, the pattern of the masks 74 may also be transferred to the dummy dielectric layers 60. The dummy gates 72 cover respective channel regions of the nanostructures 55. In some embodiments, the channel regions may be formed in the second semiconductor layers 54A-54C including the second semiconductor materials in the region 50N and the channel regions may be formed in the first semiconductor layers 52A-52C including the first semiconductor materials in the region 50P. The pattern of the masks 74 may be used to physically separate each of the dummy gates 72 from adjacent dummy gates 72. The dummy gates 72 may have a lengthwise direction substantially perpendicular to lengthwise directions of respective nanostructures 55. The dummy dielectric layers 60, the dummy gates 72, and the masks 74 may be collectively referred to as "dummy gate stacks." The dummy gates 72 may have gate lengths from about 12 nm to about 20 nm or from about 14.5 nm to about 17 nm.

Figure 7B:
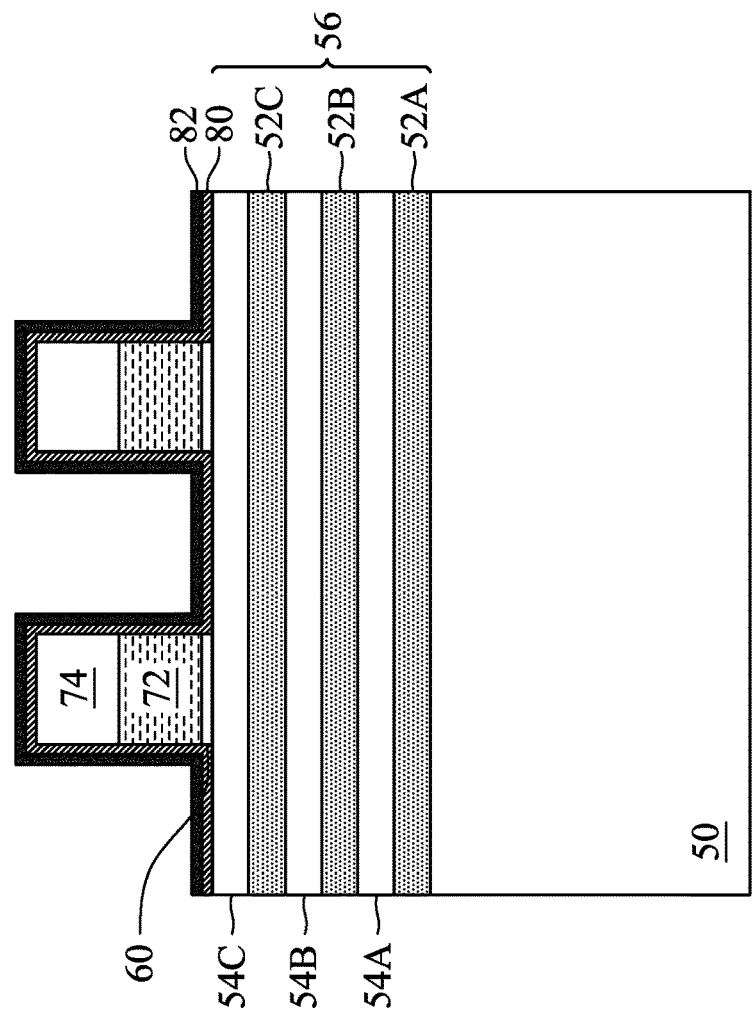
Figure 7A:
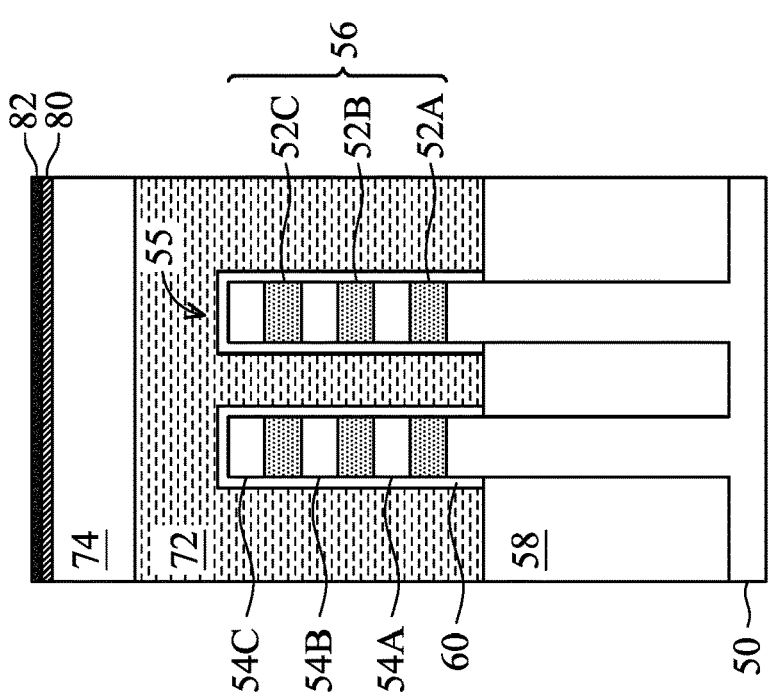
Figure 7C:
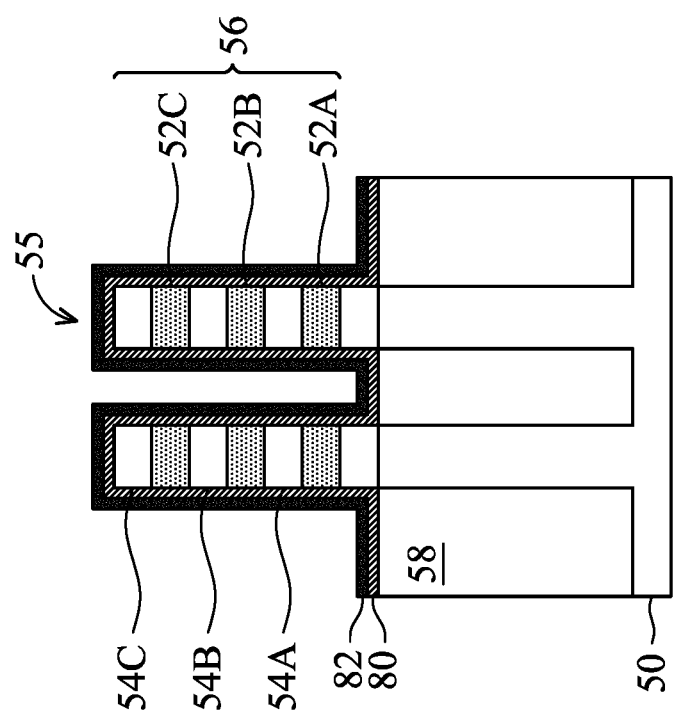

In FIGS. 7A through 7C, a first spacer layer 80 and a second spacer layer 82 are formed over the structures illustrated in FIGS. 6A through 6C. In FIGS. 7A through 7C, the first spacer layer 80 is formed on top surfaces of the STI regions 58, top surfaces and sidewalls of the nanostructures 55 and the masks 74, and sidewalls of the substrate 50, the dummy gates 72 and the dummy dielectric layers 60. The second spacer layer 82 is deposited over the first spacer layer 80. The first spacer layer 80 may be formed by thermal oxidation or deposited by CVD, ALD, or the like. The first spacer layer 80 may be formed of silicon oxide, silicon nitride, silicon oxynitride, or the like. The second spacer layer 82 may be deposited by CVD, ALD, or the like. The second spacer layer 82 may be formed of silicon oxide, silicon nitride, silicon oxynitride, or the like.

Figures 8A, 8B:
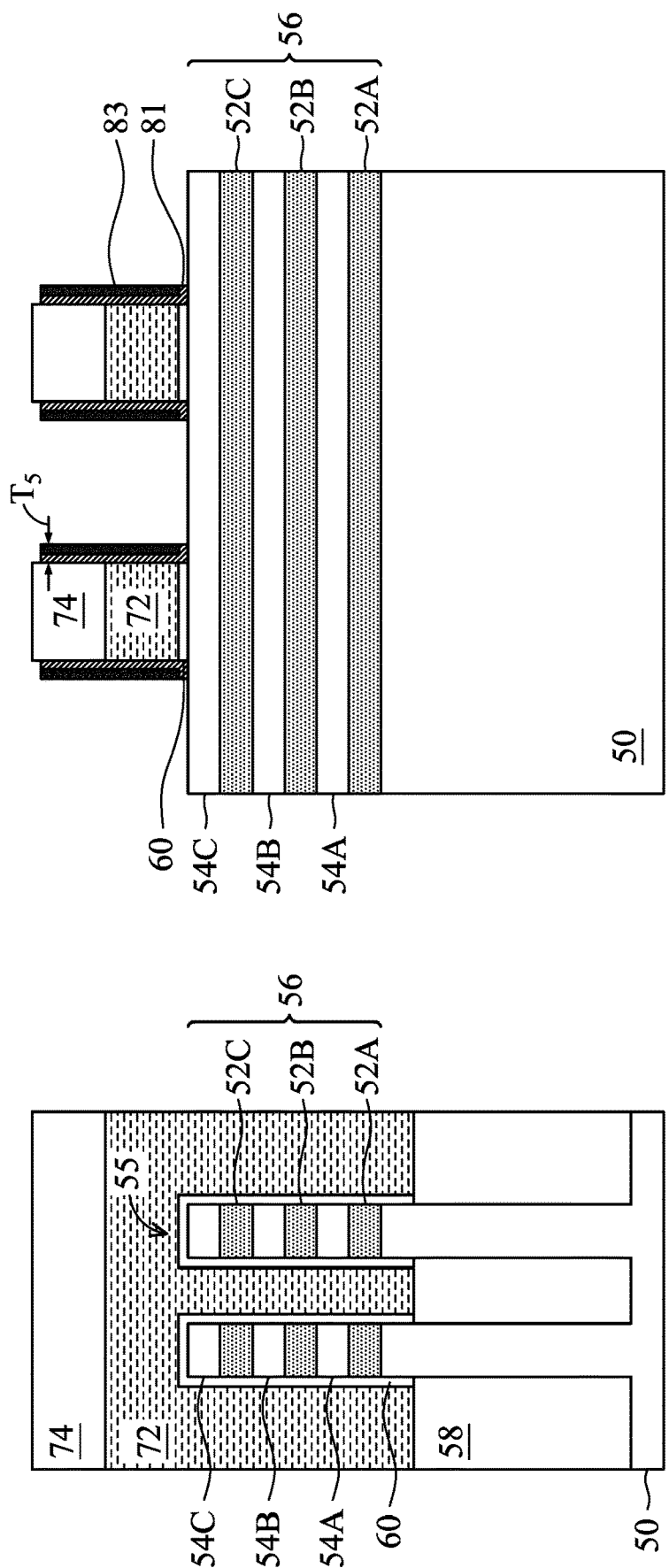
Figure 8C:
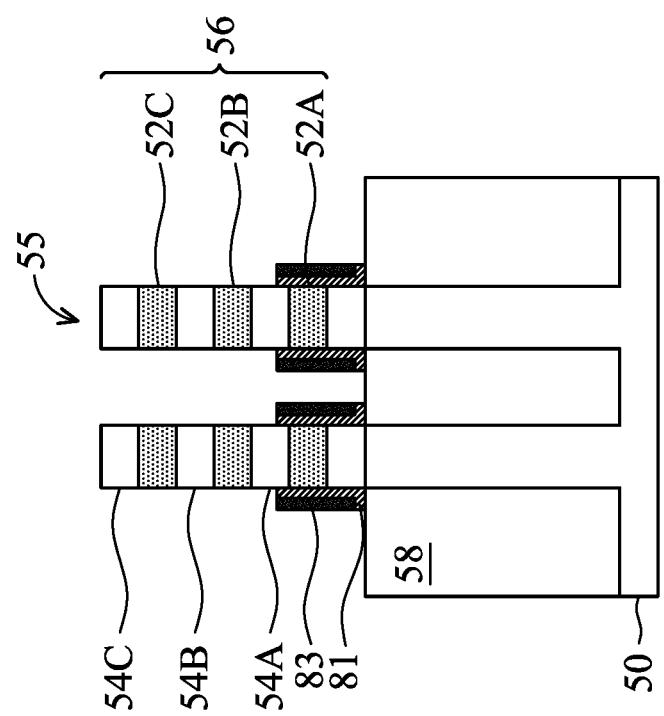

In FIGS. 8A through 8C, the first spacer layer 80 and the second spacer layer 82 are etched to form first spacers 81 and second spacers 83. The first spacer layer 80 and the second spacer layer 82 may be etched using a suitable etching process, such as an anisotropic etching process (e.g., a dry etching process) or the like. The first spacers 81 and the second spacers 83 may be disposed on sidewalls of the nanostructures 55, the dummy dielectric layers 60, the dummy gates 72, and the masks 74. The first spacers 81 and the second spacers 83 may have different heights adjacent the nanostructures 55 and the dummy gate stacks due to the etching processes used to etch the first spacer layer 80 and the second spacer layer 82, as well as differing heights between the nanostructures 55 and the dummy gate stacks. Specifically, as illustrated in FIGS. 8B and 8C, in some embodiments, the first spacers 81 and the second spacers 83 may extend partially up sidewalls of the nanostructures 55 and may extend to top surfaces of the dummy gate stacks. In some embodiments, the first spacers 81 and the second spacers 83 may extend partially up sidewalls of the dummy gate stacks. For example, top surfaces of the first spacers 81 and the second spacers 83 may be disposed above top surfaces of the dummy gates 72 and below top surfaces of the masks 74. The first spacers 81 and the second spacers 83 may have effective dielectric constants (k-values) from about 4.1 to about 5.5 or from about 4.6 to about 5.0 and thicknesses $T_5$ from about 3.5 nm to about 5.0 nm or from about 4.1 nm to about 4.4 nm.

Figure 9C:
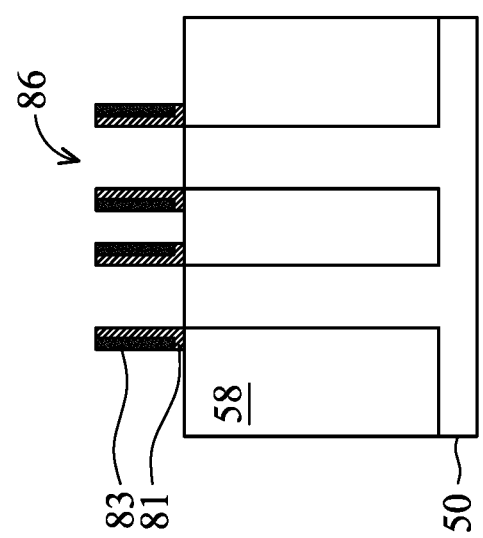

In FIGS. 9A through 9C, first recesses 86 are formed in the nanostructures 55 and the substrate 50. The first recesses 86 may extend through the first semiconductor layers 52A-52C and the second semiconductor layers 54A-54C. In some embodiments, the first recesses 86 may also extend into the substrate 50. As illustrated in FIG. 9C, top surfaces of the STI regions 58 may be level with top surfaces of the substrate 50. In some embodiments, the substrate 50 may be etched such that bottom surfaces of the first recesses 86 are disposed below the top surfaces of the STI regions 58 or the like. The first recesses 86 may be formed by etching the nanostructures 55 and/or the substrate 50 using an anisotropic etching process, such as a reactive ion etch (RIE), a neutral beam etch (NBE), or the like. The first spacers 81, the second spacers 83, and the masks 74 mask portions of the nanostructures 55 and the substrate 50 during the etching processes used to form the first recesses 86. A single etch process may be used to etch each layer of the multi-layer stack 56. In some embodiments, multiple etch processes may be used to etch the layers of the multi-layer stack 56. Timed etch processes may be used to stop the etching of the first recesses 86 after the first recesses 86 reach a desired depth.

Figure 10C:
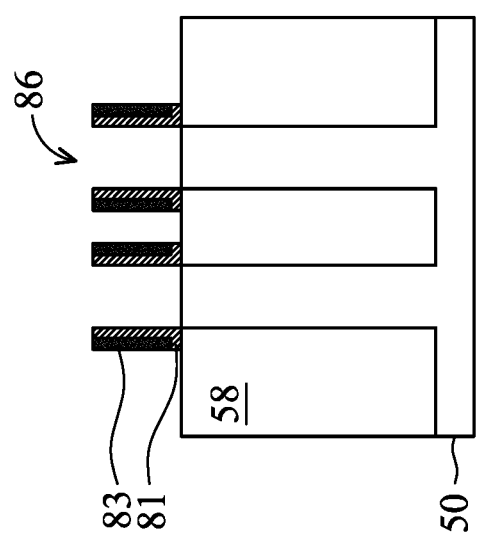

In FIGS. 10A through 10C, portions of sidewalls of the layers of the multi-layer stack 56 formed of the first semiconductor materials (e.g., the first semiconductor layers 52A-52C) exposed by the first recesses 86 are etched to form sidewall recesses 88. The sidewalls may be etched using isotropic etching processes, such as wet etching or the like. The etchants used to etch the first semiconductor layers 52A-52C may be selective to the first semiconductor materials such that the second semiconductor layers 54A-54C and the substrate 50 remain relatively unetched as compared to the first semiconductor layers 52A-52C. In an embodiment in which the first semiconductor layers 52A-52C include, e.g., SiGe, and the second semiconductor layers 54A-54C include, e.g., Si or SiC, tetramethylammonium hydroxide (TMAH), ammonium hydroxide (NH$_4$OH), or the like may be used to etch sidewalls of the multi-layer stack 56. In further embodiments, the layers of the multi-layer stack 56 may be etched using a dry etching process. Hydrogen fluoride, another fluorine-based gas, or the like may be used to etch sidewalls of the multi-layer stack 56. The sidewall recesses 88 may extend to a depth $D_1$ from about 3 nm to about 6 nm or from about 4.3 nm to about 4.7 nm and may have widths $W_1$ from about 8 nm to about 12 nm or from about 9 nm to about 11 nm.

As illustrated in FIG. 10B, sidewalls of the first semiconductor layers 52A-52C may be concave. In some embodiments, central portions of the first semiconductor layers 52A-52C may be recessed from peripheral portions of the first semiconductor layers 52A-52C by a distance ranging from about 1 nm to about 2 nm or from about 1.4 nm to about 1.6 nm. In other embodiments, sidewalls of the first semiconductor layers 52A-52C may be substantially vertical, or convex.

Figure 11B:
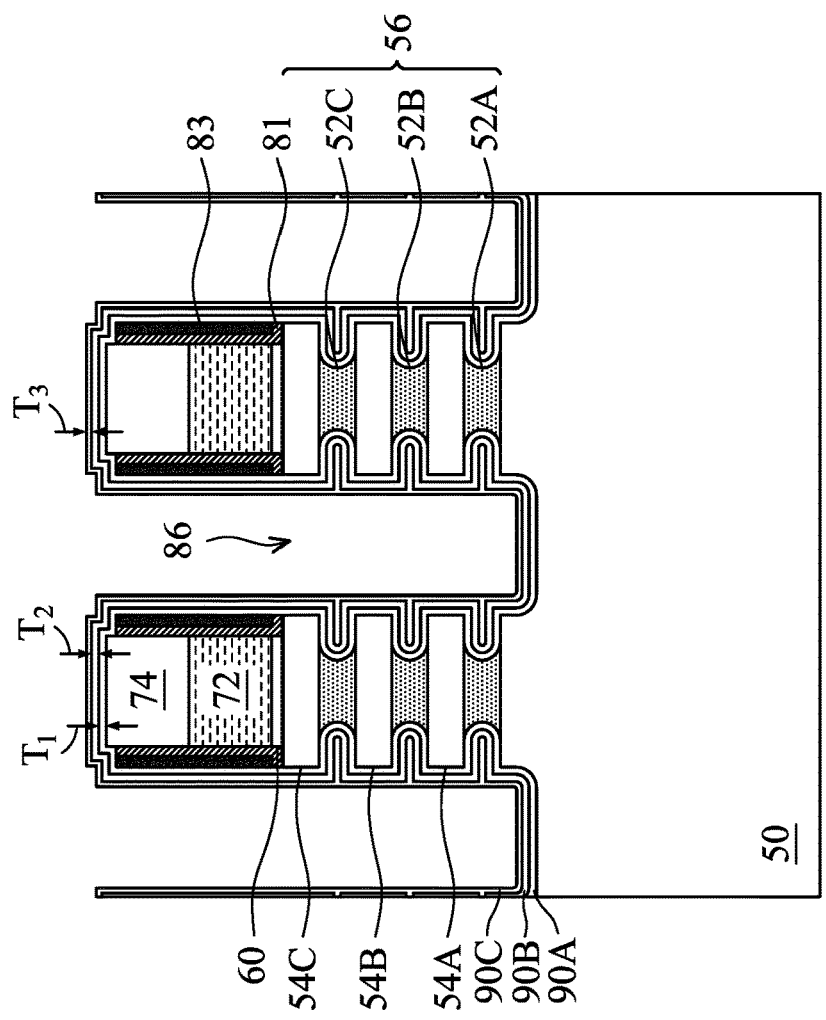
Figure 11A:
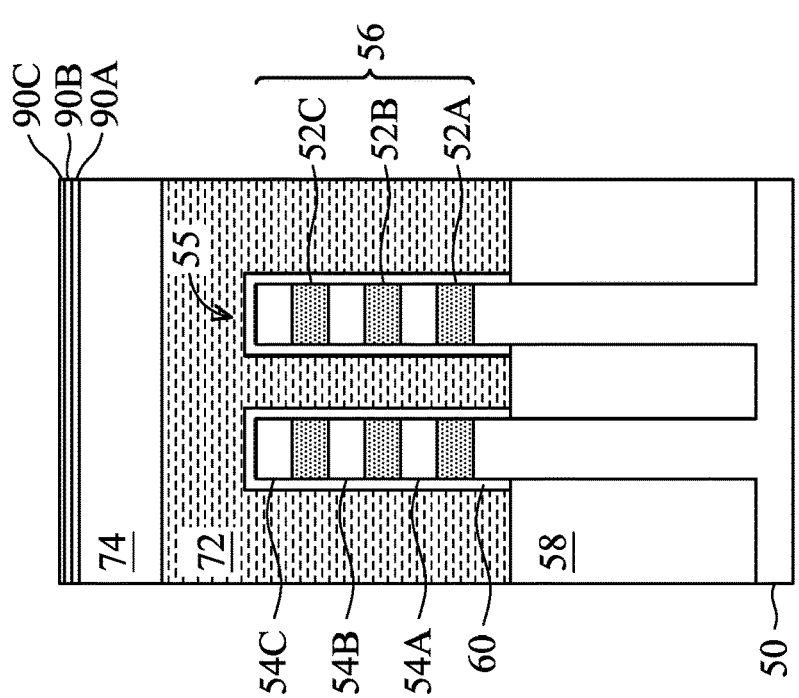
Figure 11C:
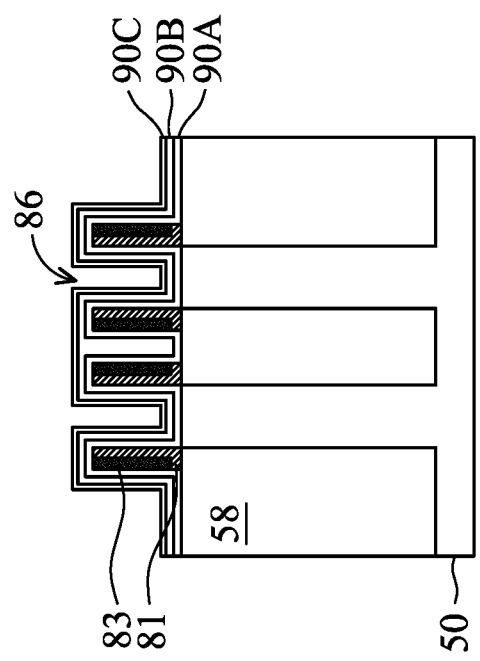

In FIGS. 11A through 11C, inner spacer layers (e.g., a first inner spacer layer 90A, a second inner spacer layer 90B, and a third inner spacer layer 90C) are deposited over the structure illustrated in FIGS. 10A through 10C. The first inner spacer layer 90A may be deposited by a conformal deposition process, such as CVD, ALD, or the like. The first inner spacer layer 90A may be deposited by a thermal deposition process with a temperature from about 500° C. to about 850° C. or from about 650° C. to about 700° C.

The first inner spacer layer 90A may be formed of a material such that a first etch selectivity, which is a ratio of the etching rate of the first semiconductor layers 52A-52C to the etching rate of the first inner spacer layer 90A, is high. As such, etching of the first inner spacer layer 90A during a subsequent removal of the first semiconductor layers 52A-52C (discussed below with respect to FIGS. 17A through 17C) may be reduced. The first etch selectivity may be greater than about 100 or may range from about 50 to about 500 or from about 150 to about 250. The material of the first inner spacer layer 90A may also be selected to have a second etch selectivity, which is a ratio of the etching rate of the second inner spacer layer 90B to the etching rate of the first inner spacer layer 90A, which is high. As such, etching of the first inner spacer layer 90A during a subsequent patterning of the first inner spacer layer 90A, the second inner spacer layer 90B, and the third inner spacer layer 90C (discussed below with respect to FIGS. 12A through 12D) may also be reduced. The second etch selectivity may be greater than about 1.5 or may range from about 1.2 to about 3.0 or from about 1.5 to about 2.5. In various embodiments, the first inner spacer layer 90A may include silicon nitride (SiN), silicon carbonitride (SiCN), silicon oxycarbide (SiOC), silicon oxycarbonitride (SiOCN), or the like. In embodiments in which the first inner spacer layer 90A comprises carbon, an atomic concentration of carbon in the first inner spacer layer 90A may be less than about 10 percent.

In embodiments in which the first inner spacer layer 90A includes silicon nitride, an atomic percentage of nitrogen in the first inner spacer layer 90A may range from about 35 percent to about 50 percent or from about 40 percent to about 45 percent. In embodiments in which the first inner spacer layer 90A includes silicon carbonitride, an atomic percentage of nitrogen in the first inner spacer layer 90A may range from about 25 percent to about 45 percent or from about 32.5 percent to about 37.5 percent and an atomic percentage of carbon in the first inner spacer layer 90A may range from about 5 percent to about 20 percent or from about 10 percent to about 15 percent. The first inner spacer layer 90A may have a density from about 2.5 g/cm$^3$ to about 2.9 g/cm$^3$. A dielectric constant (k-value) of the first inner spacer layer 90A may be from about 6.0 to about 7.3 or from about 6.5 to about 6.8. The first inner spacer layer 90A may be deposited to a thickness $T_1$ from about 0.5 nm to about 1.5 nm or from about 0.8 nm to about 1.2 nm.

The second inner spacer layer 90B may then be deposited over the first inner spacer layer 90A. The second inner spacer layer 90B may be deposited by a conformal deposition process, such as CVD, ALD, or the like. The second inner spacer layer 90B may be deposited by a thermal deposition process with a temperature from about 500° C. to about 850° C. or from about 650° C. to about 700° C.

The second inner spacer layer 90B may be formed of a low-k material to reduce the effective k-value of inner spacers formed from the first inner spacer layer 90A, the second inner spacer layer 90B, and the third inner spacer layer 90C (such as inner spacers 90, discussed below with respect to FIGS. 12A through 12D). For example, a dielectric constant (k-value) of the second inner spacer layer 90B may be from about 4.2 to about 5.7 or from about 4.8 to about 5.1. In some embodiments, the second inner spacer layer 90B may include silicon oxycarbonitride (SiOCN), silicon oxynitride (SiON), or the like.

An atomic percentage of carbon in the second inner spacer layer 90B may be from about 0 percent to about 5 percent, less than about 5 percent, or about 2.5 percent. An atomic percentage of nitrogen in the second inner spacer layer 90B may be from about 10 percent to about 35 percent or from about 20 percent to about 25 percent. An atomic percentage of oxygen in the second inner spacer layer 90B may range from about 30 percent to about 60 percent or from about 42.5 percent to about 47.5 percent. The second inner spacer layer 90B may be deposited to a thickness $T_2$ from about 1 nm to about 3 nm or from about 1.8 nm to about 2.2 nm.

The third inner spacer layer 90C may then be deposited over the second inner spacer layer 90B. The third inner spacer layer 90C may be deposited by a conformal deposition process, such as CVD, ALD, or the like. The third inner spacer layer 90C may be deposited by a thermal deposition process with a temperature from about 500° C. to about 850° C. or from about 650° C. to about 700° C.

The third inner spacer layer 90C may be formed of a low-k material to reduce the effective k-value of inner spacers formed from the first inner spacer layer 90A, the second inner spacer layer 90B, and the third inner spacer layer 90C (such as inner spacers 90, discussed below with respect to FIGS. 12A through 12D). For example, a dielectric constant (k-value) of the third inner spacer layer 90C may be from about 4.5 to about 6.0 or from about 5.1 to about 5.4. The material of the third inner spacer layer 90C may also be selected to have a third etch selectivity, which is a ratio of the etching rate of the second inner spacer layer 90B to the etching rate of the third inner spacer layer 90C, which is high. As such, etching of the third inner spacer layer 90C during a subsequent patterning of the first inner spacer layer 90A, the second inner spacer layer 90B, and the third inner spacer layer 90C (discussed below with respect to FIGS. 12A through 12D) may be reduced. The third etch selectivity may be greater than about 1.5 or may range from about 1.2 to about 3.0 or from about 1.5 to about 2.5. In some embodiments, the third inner spacer layer 90C may include silicon nitride (SiN), silicon oxycarbonitride (SiOCN), silicon oxynitride (SiON), or the like.

In embodiments in which the third inner spacer layer 90C comprises silicon nitride, an atomic percentage of nitrogen in the third inner spacer layer 90C may range from about 35 percent to about 50 percent or from about 40 percent to about 45 percent. In embodiments in which the third inner spacer layer 90C comprises silicon oxycarbonitride or silicon oxynitride, an atomic percentage of carbon in the third inner spacer layer 90C may be less than about 10 percent, may range from about 3 percent to about 10 percent or from about 5 percent to about 8 percent, or may be about 0 percent; an atomic percentage of nitrogen in the third inner spacer layer 90C may range from about 30 percent to about 50 percent or from about 37.5 percent to about 42.5 percent; and an atomic percentage of oxygen in the third inner spacer layer 90C may range from about 25 percent to about 55 percent or from about 37.5 percent to about 42.5 percent. The second inner spacer layer 90B may have a greater atomic percentage of oxygen than the first inner spacer layer 90A and the third inner spacer layer 90C. The third inner spacer layer 90C may be deposited to a thickness $T_3$ from about 1.5 nm to about 3.5 nm or from about 2.3 nm to about 2.7 nm. In some embodiments, the third inner spacer layer 90C and the second inner spacer layer 90B may have a combined thickness from about 3.5 nm to about 5.5 nm or from about 4.3 nm to about 4.7 nm.

Including low-k materials for the second inner spacer layer 90B and the third inner spacer layer 90C may be contrary to conventional wisdom, as low-k materials may have low etch selectivity to etchants used to remove the first semiconductor layers 52A-52C (discussed below with respect to FIGS. 17A through 17C). However, because the first inner spacer layer 90A may be formed of materials having high etch selectivity to the etchants used to remove the first semiconductor layers 52A-52C, the second inner spacer layer 90B and the third inner spacer layer 90C may be protected from the etchants used to remove the first semiconductor layers 52A-52C and the low-k materials may be used for the second inner spacer layer 90B and the third inner spacer layer 90C. This may reduce effective k-values for inner spacers (such as inner spacers 90, discussed below with respect to FIGS. 12A through 12D) including the second inner spacer layer 90B and the third inner spacer layer 90C, reducing the effective capacitance ($C_{eff}$) of semiconductor devices including the inner spacers and improving device performance.

Gradient regions may be formed between the first inner spacer layer 90A and the second inner spacer layer 90B and between the second inner spacer layer 90B and the third inner spacer layer 90C. A gradient region between the first inner spacer layer 90A and the second inner spacer layer 90B may have a thickness from about 0.5 nm to about 1.0 nm or from about 0.7 nm to about 0.8 nm and an atomic concentration of oxygen from about 0 percent to about 60 percent or from about 27.5 percent to about 32.5 percent. A gradient region between the second inner spacer layer 90B and the third inner spacer layer 90C may have a thickness from about 0.5 nm to about 1.0 nm or from about 0.7 nm to about 0.8 nm and an atomic concentration of oxygen from about 25 percent to about 60 percent or from about 40 percent to about 45 percent.

In some embodiments, the first inner spacer layer 90A, the second inner spacer layer 90B, and the third inner spacer layer 90C may be deposited in situ such that no native oxides are formed at interfaces between the first inner spacer layer 90A and the second inner spacer layer 90B or between the second inner spacer layer 90B and the third inner spacer layer 90C. The first inner spacer layer 90A, the second inner spacer layer 90B, and the third inner spacer layer 90C may be deposited by processes having conformities of greater than about 95 percent and may be deposited in sidewall recesses 88 having aspect ratios (ratios of the depth $D_1$ of the sidewall recesses 88 to the width $W_1$ of the sidewall recesses 88) of greater than about 20. A ratio of the thickness $T_1$ of the first inner spacer layer 90A to the thickness $T_2$ of the second inner spacer layer 90B may be from about 0.3 to about 1.0 or from about 0.4 to about 0.6. A ratio of the thickness $T_2$ of the second inner spacer layer 90B to the thickness $T_3$ of the third inner spacer layer 90C may be from about 0.5 to about 1.5 or from about 0.4 to about 0.6. A ratio of the thickness $T_1$ of the first inner spacer layer 90A to the thickness $T_3$ of the third inner spacer layer 90C may be from about 0.3 to about 1.0 or from about 0.4 to about 0.6.

Although three inner spacer layers are described as being formed, more or fewer inner spacer layers may be formed. For example, in some embodiments, less than three inner spacer layers, such as two inner spacer layers, or more than three inner spacer layers, such as four or more inner spacer layers may be formed over the structures illustrated in FIGS. 10A through 10C. Processes the same as or similar to those described above may be used in embodiments including different numbers of inner spacer layers.

In an embodiment in which two inner spacer layers are formed, a first inner spacer layer may be the same as or similar to the first inner spacer layer 90A and a second inner spacer layer may be the same as or similar to either of the second inner spacer layer 90B or the third inner spacer layer 90C. As such, the second inner spacer layer may include silicon nitride (SiN), silicon oxycarbonitride (SiOCN), silicon oxynitride (SiON), or the like. In embodiments in which the second inner spacer layer comprises silicon nitride, an atomic percentage of nitrogen in the second inner spacer layer may range from about 35 percent to about 50 percent or from about 40 percent to about 45 percent. In embodiments in which the second inner spacer layer comprises silicon oxycarbonitride or silicon oxynitride, an atomic percentage of carbon in the second inner spacer layer may be less than about 10 percent, may range from about 0 percent to about 10 percent or from about 2.5 percent to about 7.5 percent, or may be about 0 percent; an atomic percentage of nitrogen in the second inner spacer layer may range from about 10 percent to about 50 percent or from about 27.5 percent to about 32.5 percent; and an atomic percentage of oxygen in the second inner spacer layer may range from about 25 percent to about 60 percent or from about 40 percent to about 45 percent. A dielectric constant (k-value) of the second inner spacer layer may be from about 4.2 to about 6.0 or from about 4.9 to about 5.3. A ratio of the thickness of the first inner spacer layer to the thickness of the second inner spacer layer may be from about 0.3 to about 1.0 or from about 0.4 to about 0.5. Including the first inner spacer layer and the second inner spacer layer having the prescribed ratio of thicknesses may minimize the effective k-value of inner spacers formed from the first inner spacer layer and the second inner spacer layer, while preventing etching of the second inner spacer layer during a removal of the first semiconductor layers 52A-52C (discussed below with respect to FIGS. 17A through 17C).

Figures 12A, 12B:
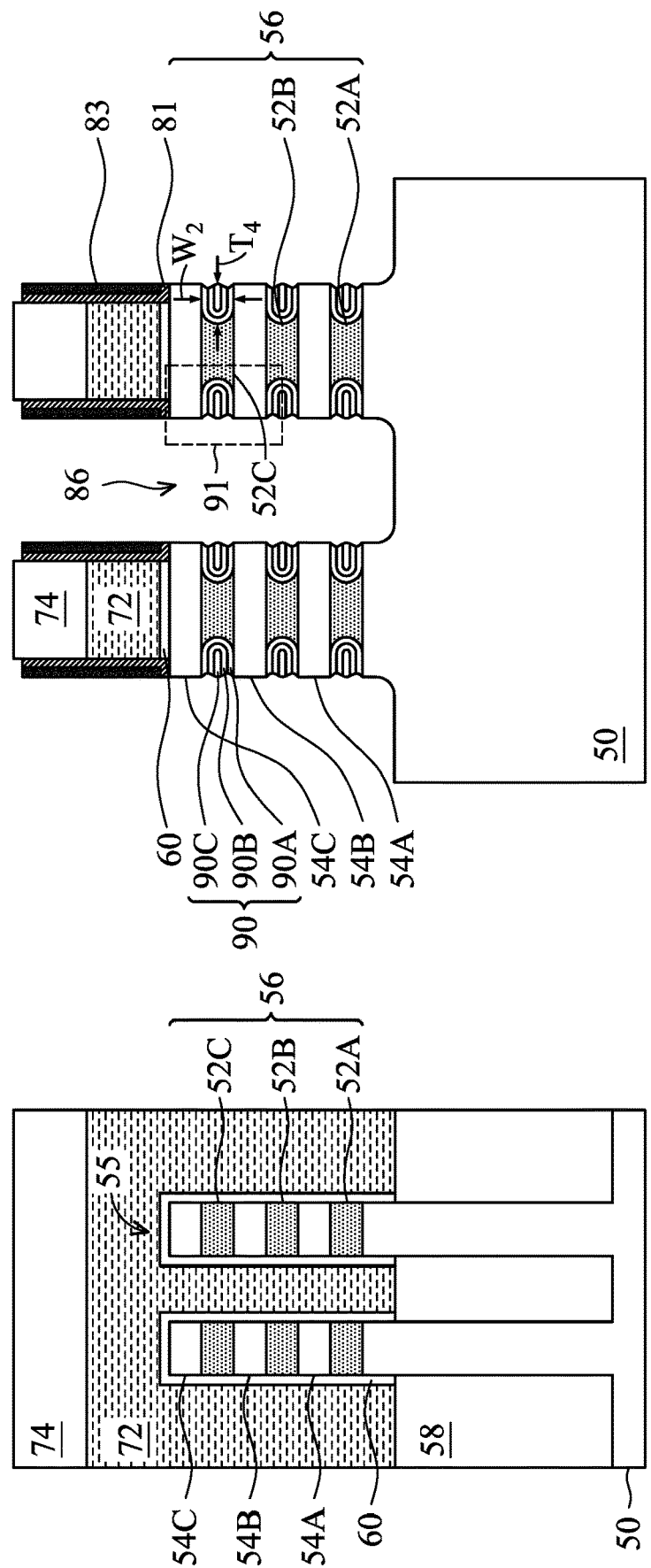
Figure 12D:
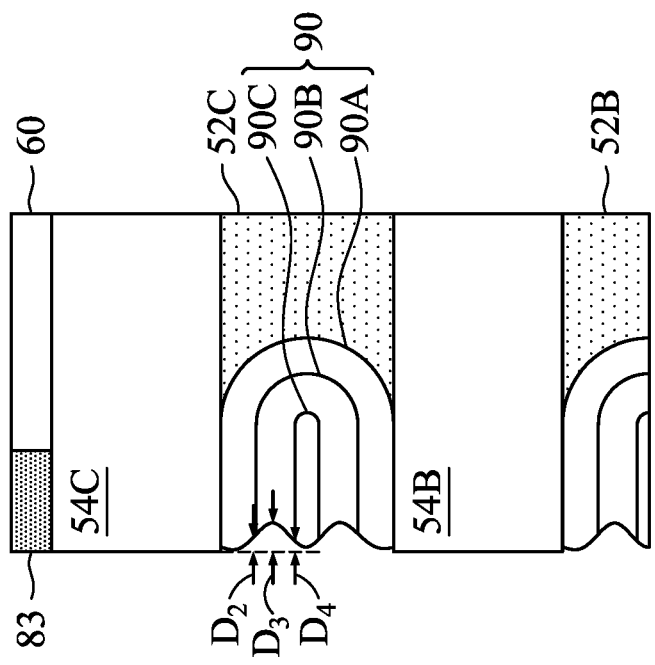
Figure 12C:
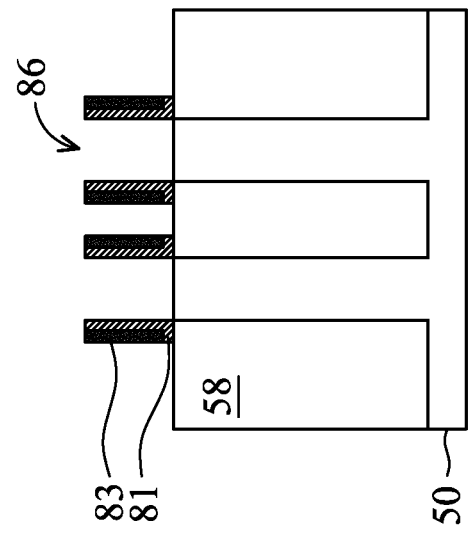

In FIGS. 12A through 12D, the first inner spacer layer 90A, the second inner spacer layer 90B, and the third inner spacer layer 90C are etched to form inner spacers 90. FIG. 12D illustrates a detailed view of region 91 of FIG. 12B. The etching process of the first inner spacer layer 90A, the second inner spacer layer 90B, and the third inner spacer layer 90C may be a dry etching process or a wet etching process and may be isotropic. When a wet etching process is used, the first inner spacer layer 90A, the second inner spacer layer 90B, and the third inner spacer layer 90C may be etched using sulfuric acid ($H_2SO_4$), phosphoric acid ($H_3PO_4$), dilute hydrofluoric acid (dHF), combinations thereof, or the like.

As illustrated in FIGS. 12B and 12D, each of the inner spacers 90 may be D-shaped in a cross-sectional view. The third inner spacer layer 90C may be the innermost layer and may be D-shaped in the cross-sectional view. The second inner spacer layer 90B may be C-shaped in the cross-sectional view and may wrap around a top surface, a bottom surface, and a side surface of the third inner spacer layer 90C. The first inner spacer layer 90A may be C-shaped in the cross-sectional view and may wrap around a top surface, a bottom surface, and a side surface of the second inner spacer layer 90B.

As discussed previously the first inner spacer layer 90A, the second inner spacer layer 90B, and the third inner spacer layer 90C may be formed of material such that a second etch selectivity and a third etch selectivity are high. As a result, the second inner spacer layer 90B is etched at a higher rate than the first inner spacer layer 90A or the third inner spacer layer 90C. As illustrated in FIG. 12D, this results in the inner spacers 90 having W-shaped sidewalls in a cross-sectional view. The first inner spacer layer 90A, the second inner spacer layer 90B, and the third inner spacer layer 90C may be etched such that sidewalls of the first inner spacer layer 90A are recessed a depth $D_2$ ranging from about 0 Å to about 10 Å from sidewalls of the second semiconductor layers 54A-54C, sidewalls of the second inner spacer layer 90B are recessed a depth $D_3$ ranging from about 5 Å to about 10 Å from sidewalls of the second semiconductor layers 54A-54C, and sidewalls of the third inner spacer layer 90C are recessed a depth $D_4$ ranging from about 0 Å to about 10 Å from sidewalls of the second semiconductor layers 54A-54C. As such, a depth of the sidewalls of the inner spacers 90 from the sidewalls of the second semiconductor layers 54A-54C may be less than about 10 Å. Maintaining the depth of the sidewalls of the inner spacers 90 from the sidewalls of the second semiconductor layers 54A-54C below about 10 Å may assist in reducing the effective k-value of the inner spacers 90. A ratio of $D_2:D_3$ may be from about 0.2 to about 1.0 and a ratio of $D_3:D_4$ may be from about 0.2 to about 1.0. The inner spacers 90 may have a thickness $T_4$ from about 3 nm to about 6 nm, from about 4.3 nm to about 4.7 nm, or greater than about 3 nm, and a width $W_2$ from about 8 nm to about 12 nm or from about 9.5 nm to about 10.5 nm. Maintaining the thickness $T_4$ of the inner spacers 90 above about 3 nm may assist in reducing the effective k-value of the inner spacers 90. A ratio of the thickness $T_4$ of the inner spacers 90 to the width $W_2$ of the inner spacers 90 may be from about 0.5 to about 1.0 or from about 0.6 to about 0.8. The inner spacers 90 may have an effective k-value from about 4.0 to about 6.0 or from about 4.8 to about 5.2.

By using different materials having different dielectric constants and etch selectivities for the first inner spacer layer 90A, the second inner spacer layer 90B, and the third inner spacer layer 90C, the effective k-value of the inner spacers 90 may be reduced, profiles of the inner spacers 90 may be improved, and excessive etching of the first inner spacer layer 90A, the second inner spacer layer 90B, and the third inner spacer layer 90C can be avoided. This results in NSFETs including the inner spacers 90 having reduced effective capacitance ($C_{eff}$), improved performance, and reduced device defects.

Figures 13A, 13B:
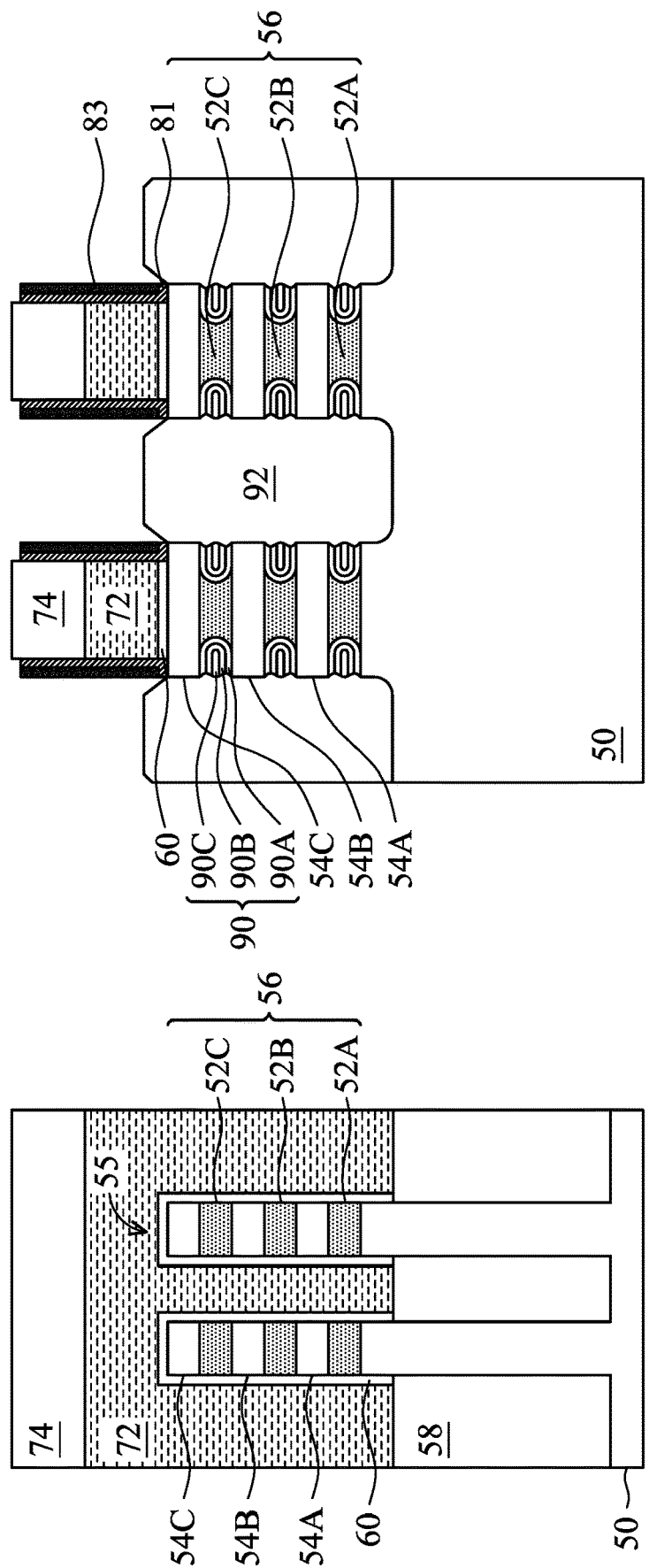

In FIGS. 13A through 13D, epitaxial source/drain regions 92 are formed in the first recesses 86 to exert stress on the second semiconductor layers 54A-54C of the nanostructures 55, thereby improving performance. As illustrated in FIG. 13B, the epitaxial source/drain regions 92 are formed in the first recesses 86 such that each dummy gate 72 is disposed between respective neighboring pairs of the epitaxial source/drain regions 92. In some embodiments, the first spacers 81 are used to separate the epitaxial source/drain regions 92 from the dummy gates 72 by an appropriate lateral distance so that the epitaxial source/drain regions 92 do not short out subsequently formed gates of the resulting NSFETs.

The epitaxial source/drain regions 92 in the region 50N, e.g., the NMOS region, may be formed by masking the region 50P, e.g., the PMOS region. Then, the epitaxial source/drain regions 92 are epitaxially grown in the first recesses 86. The epitaxial source/drain regions 92 may include any acceptable material, such as appropriate for n-type NSFETs. For example, if the second semiconductor layers 54A-54C are silicon, the epitaxial source/drain regions 92 may include materials exerting a tensile strain on the second semiconductor layers 54A-54C, such as silicon, silicon carbide, phosphorous doped silicon carbide, silicon phosphide, or the like. The epitaxial source/drain regions 92 may have surfaces raised from respective surfaces of the multi-layer stack 56 and may have facets.

The epitaxial source/drain regions 92 in the region 50P, e.g., the PMOS region, may be formed by masking the region 50N, e.g., the NMOS region. Then, the epitaxial source/drain regions 92 are epitaxially grown in the first recesses 86. The epitaxial source/drain regions 92 may include any acceptable material, such as appropriate for p-type NSFETs. For example, if the second semiconductor layers 54A-54C are silicon germanium, the epitaxial source/drain regions 92 may comprise materials exerting a compressive strain on the second semiconductor layers 54A-54C, such as silicon germanium, boron doped silicon germanium, germanium, germanium tin, or the like. The epitaxial source/drain regions 92 may also have surfaces raised from respective surfaces of the multi-layer stack 56 and may have facets.

The epitaxial source/drain regions 92, the first semiconductor layers 52A-52C, the second semiconductor layers 54A-54C, and/or the substrate 50 may be implanted with dopants to form source/drain regions, similar to the process previously discussed for forming wells, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

Figure 13D:
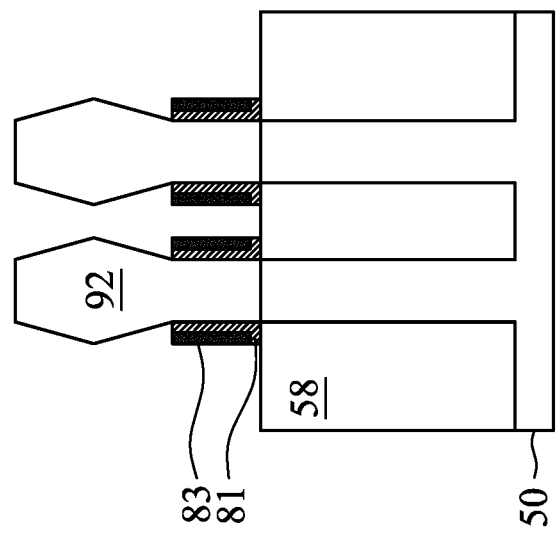
Figure 13C:
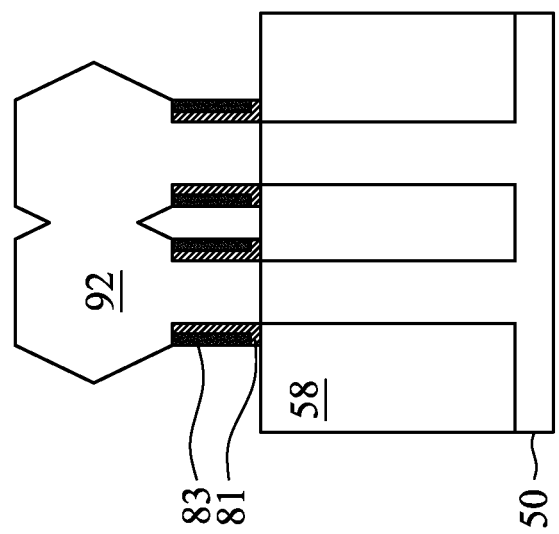

As a result of the epitaxy processes used to form the epitaxial source/drain regions 92 in the region 50N and the region 50P, upper surfaces of the epitaxial source/drain regions 92 have facets which expand laterally outward beyond sidewalls of the nanostructures 55. In some embodiments, these facets cause adjacent epitaxial source/drain regions 92 of a same NSFET to merge as illustrated by FIG. 13C. In some embodiments, adjacent epitaxial source/drain regions 92 remain separated after the epitaxy process is completed as illustrated by FIG. 13D. In the embodiments illustrated in FIGS. 13C and 13D, the first spacers 81 may be formed covering portions of the sidewalls of the nanostructures 55 and/or the substrate 50 that extend above the STI regions 58 thereby blocking the epitaxial growth. In some embodiments, the spacer etch used to form the first spacers 81 may be adjusted to remove the spacer material to allow the epitaxially grown region to extend to the surface of the STI region 58.

Figures 14A, 14B:
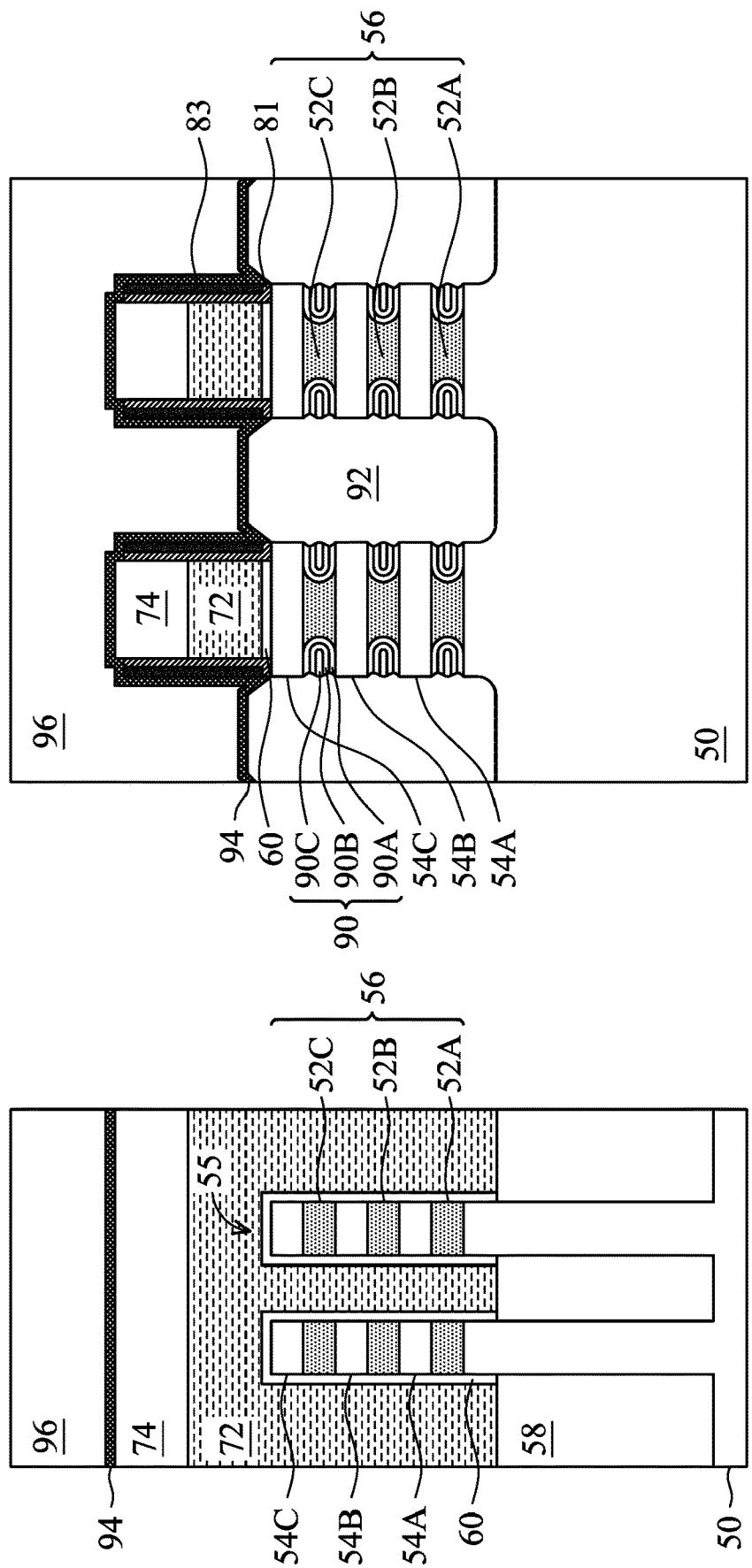
Figure 14C:
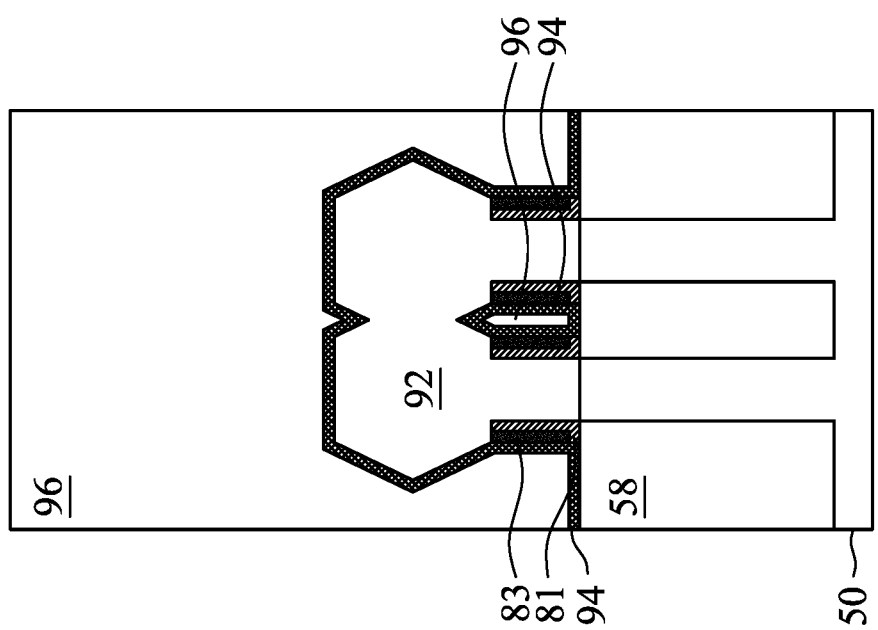

In FIGS. 14A through 14C, a first interlayer dielectric (ILD) 96 is deposited over the structure illustrated in FIGS. 13A through 13C, respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81. The CESL 94 may comprise a dielectric material, such as, silicon nitride, silicon oxide, silicon oxynitride, or the like, having a different etch rate than the material of the overlying first ILD 96.

Figures 15A, 15B:
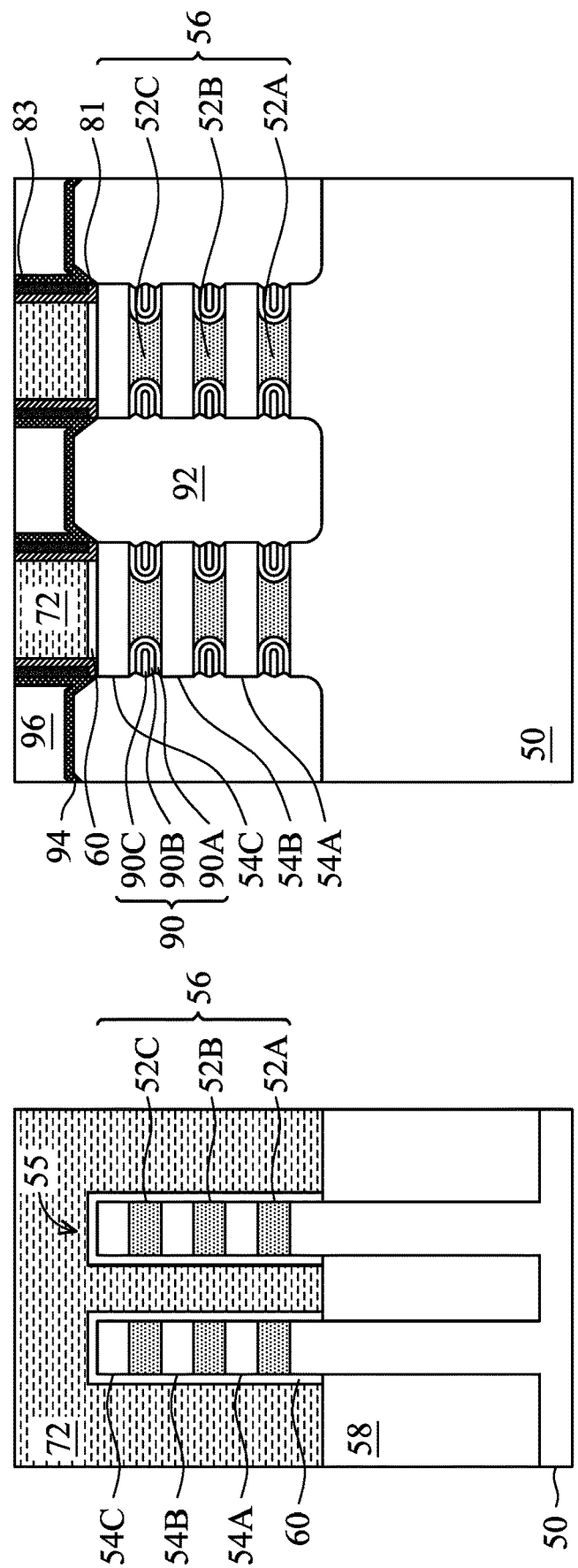
Figure 15C:
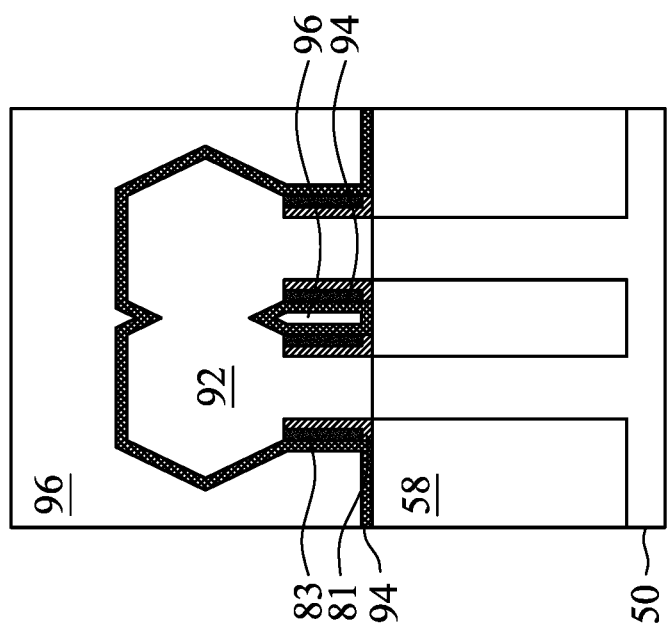

In FIGS. 15A through 15C, a planarization process, such as a CMP, may be performed to level the top surface of the first ILD 96 with the top surfaces of the dummy gates 72 or the masks 74. The planarization process may also remove the masks 74 on the dummy gates 72, and portions of the first spacers 81 along sidewalls of the masks 74, as per the embodiment illustrated in FIGS. 15A through 15C. After the planarization process, top surfaces of the dummy gates 72, the first spacers 81, and the first ILD 96 are level. Accordingly, the top surfaces of the dummy gates 72 are exposed through the first ILD 96. In some embodiments, the masks 74 may remain, in which case the planarization process levels the top surface of the first ILD 96 with top surface of the masks 74 and the first spacers 81.

Figures 16A, 16B:
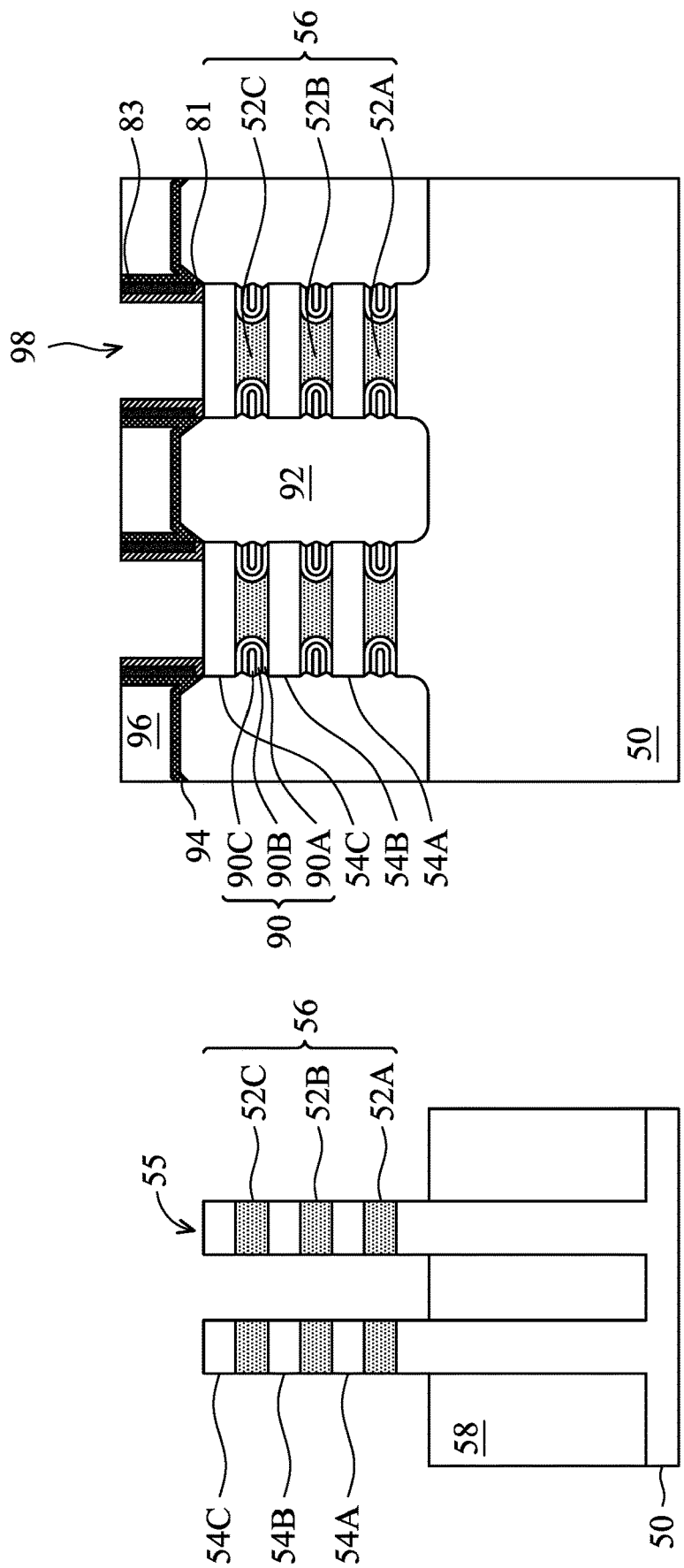
Figure 16C:
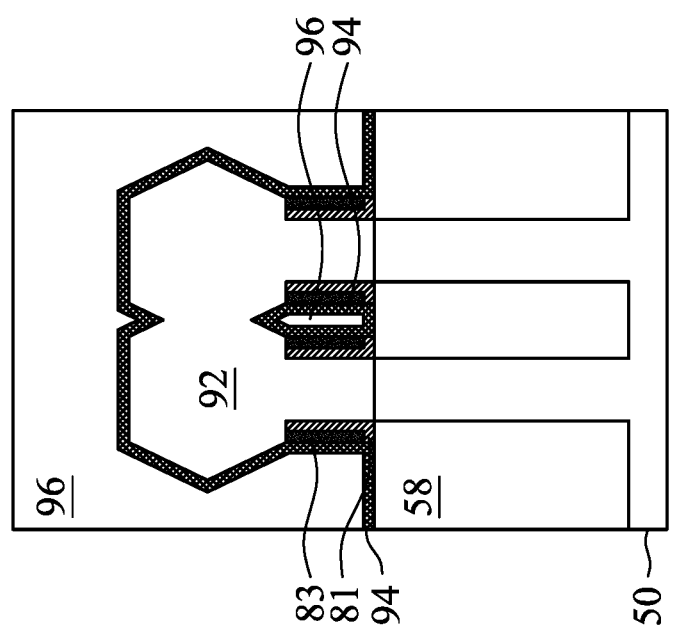

In FIGS. 16A through 16C, the dummy gates 72, and the masks 74 if present, are removed in an etching step(s), so that second recesses 98 are formed. Portions of the dummy dielectric layers 60 in the second recesses 98 may also be removed. In some embodiments, the dummy gates 72 are removed by an anisotropic dry etch process. For example, the etching process may include a dry etch process using reaction gas(es) that selectively etch the dummy gates 72 at a faster rate than the first ILD 96 or the first spacers 81. Each second recess 98 exposes and/or overlies portions of the multi-layer stack 56, which act as channel regions in subsequently completed NSFETs. Portions of the multi-layer stack 56 which act as the channel regions are disposed between neighboring pairs of the epitaxial source/drain regions 92. During the removal, the dummy dielectric layers 60 may be used as etch stop layers when the dummy gates 72 are etched. The dummy dielectric layers 60 may then be removed after the removal of the dummy gates 72.

Figure 17B:
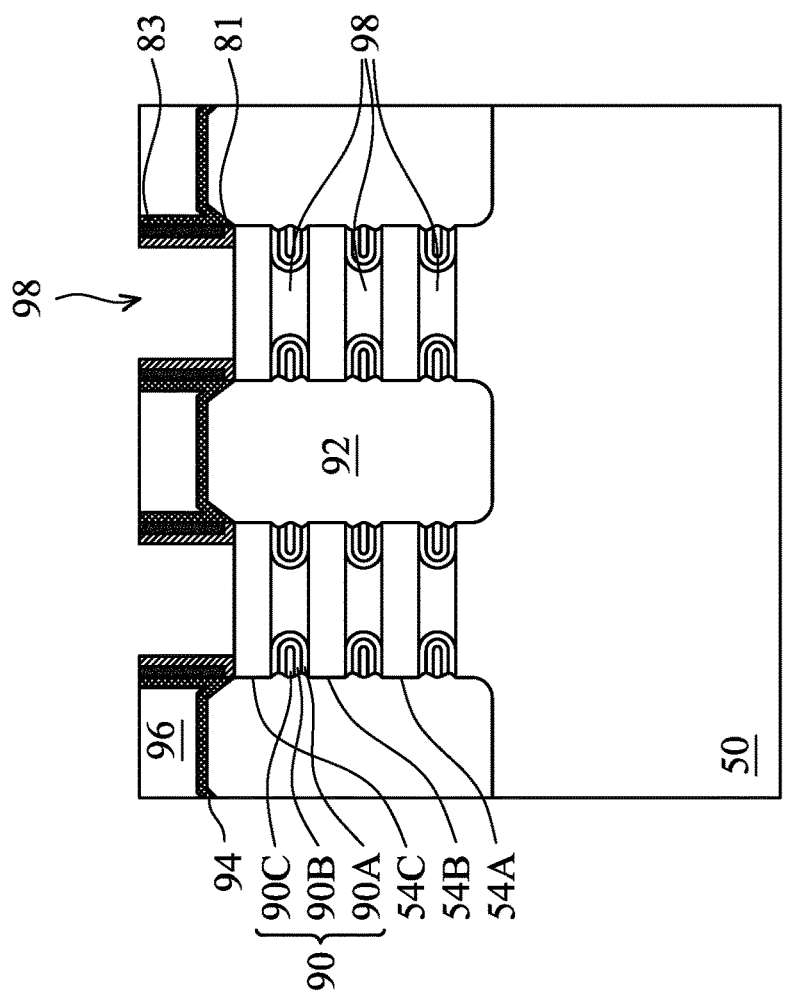
Figure 17A:
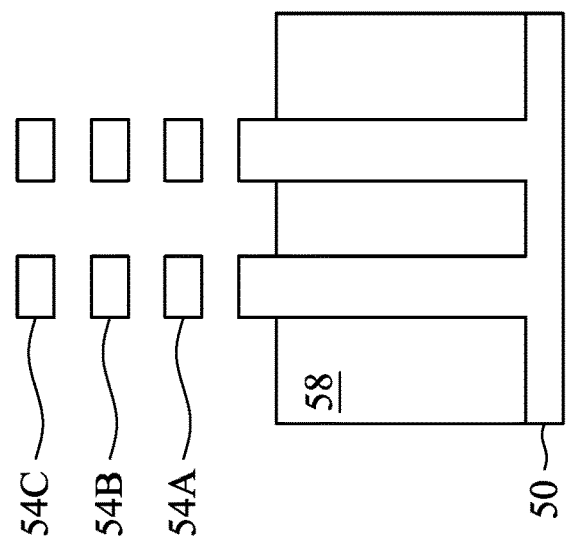
Figure 17C:
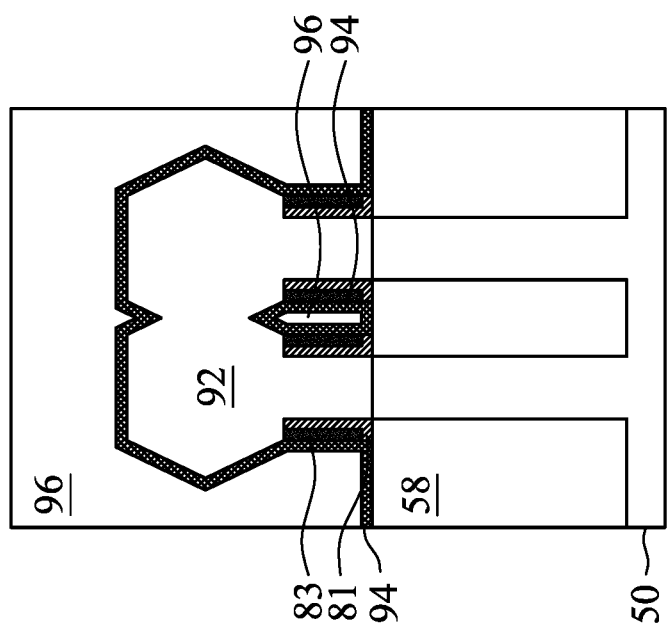

In FIGS. 17A through 17C, the first semiconductor layers 52A-52C are removed extending the second recesses 98. The first semiconductor layers 52A-52C may be removed by an isotropic etching process such as wet etching, dry etching, or the like. The first semiconductor layers 52A-52C may be removed using etchants which are selective to the materials of the first semiconductor layers 52A-52C, while the second semiconductor layers 54A-54C, the substrate 50, the STI regions 58, and the first inner spacer layer 90A remain relatively unetched as compared to the first semiconductor layers 52A-52C. In an embodiment in which the first semiconductor layers 52A-52C include, e.g., SiGe, and the second semiconductor layers 54A-54C include, e.g., Si and the first semiconductor layers 52A-52C are removed by wet etching, tetramethylammonium hydroxide (TMAH), ammonium hydroxide ($NH_4OH$), ozone ($O_3$), ammonia ($NH_3$), a first chemical solution, a second chemical solution, a combination thereof, or the like may be used to remove the first semiconductor layers 52A-52C. The first chemical solution (sometimes referred to as standard clean 1 (SC1) solution) may include ammonium hydroxide ($NH_4OH$), hydrogen peroxide ($H_2O_2$), and water ($H_2O$). The second chemical solution (sometimes referred to as standard clean 2 (SC2) solution) may include hydrochloric acid (HCl), hydrogen peroxide ($H_2O_2$), and water ($H_2O$). In an embodiment in which the first semiconductor layers 52A-52C are removed by dry etching, hydrogen fluoride (HF), fluorine ($F_2$), other fluorine-based gases, chlorine-based gases, or the like may be used to remove the first semiconductor layers 52A-52C.

As discussed previously, the first inner spacer layer 90A may be formed of a material having a high first etch selectivity relative to the material of the first semiconductor layers 52A-52C. Removing the first semiconductor layers 52A-52C may cause some etching of the first inner spacer layer 90A. For example, the etching process used to remove the first semiconductor layers 52A-52C may etch exposed surfaces of the first inner spacer layer 90A to a depth from about 0.5 nm to about 1.5 nm or from about 0.8 nm to about 1.2 nm. The first inner spacer layer 90A may be deposited to a thickness such that the second inner spacer layer 90B remains unexposed by the first inner spacer layer 90A after removing the first semiconductor layers 52A-52C. Including the first inner spacer layer 90A which is formed of a material having a high first etch selectivity prevents etching of the second inner spacer layer 90B and the third inner spacer layer 90C (formed of low-k dielectric materials), such that the effective k-value of the inner spacers 90 may be reduced, profiles of the inner spacers 90 may be improved, and excessive etching of the first inner spacer layer 90A, the second inner spacer layer 90B, and the third inner spacer layer 90C can be avoided. This results in NSFETs including the inner spacers 90 having reduced effective capacitance ($C_{eff}$), improved performance, and reduced device defects.

Figure 18B:
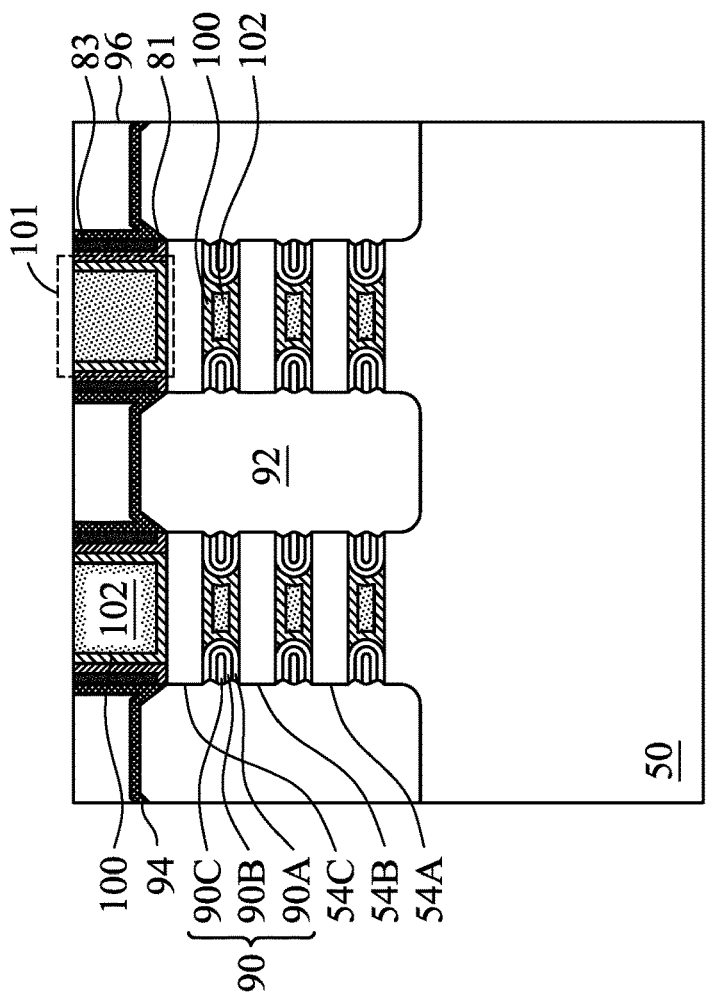
Figure 18A:
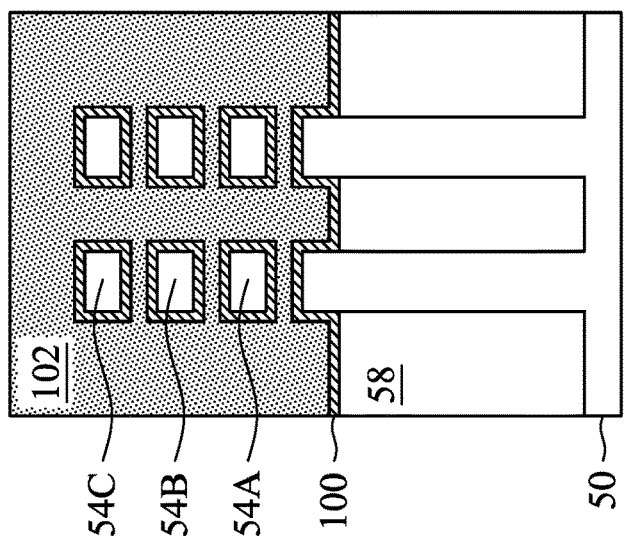
Figure 18D:
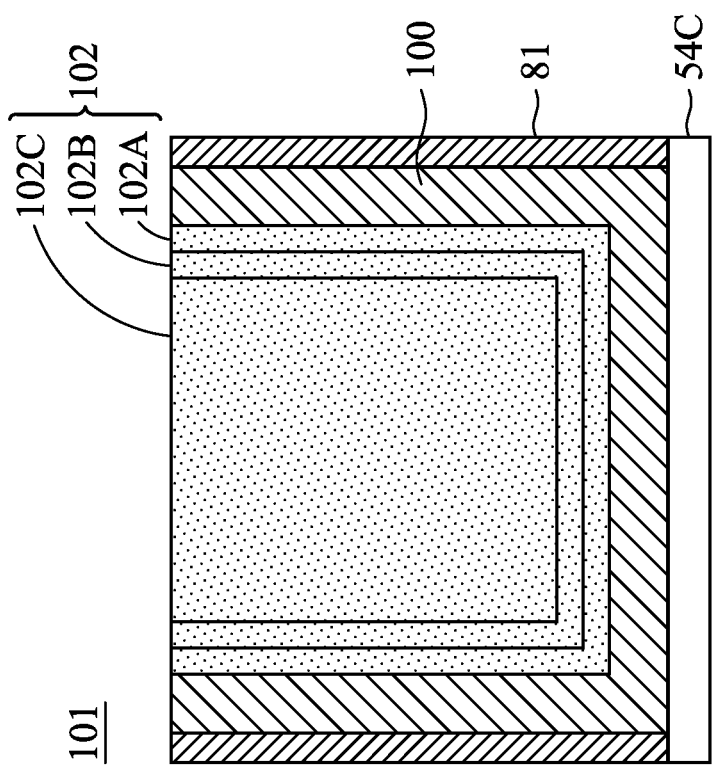
Figure 18C:
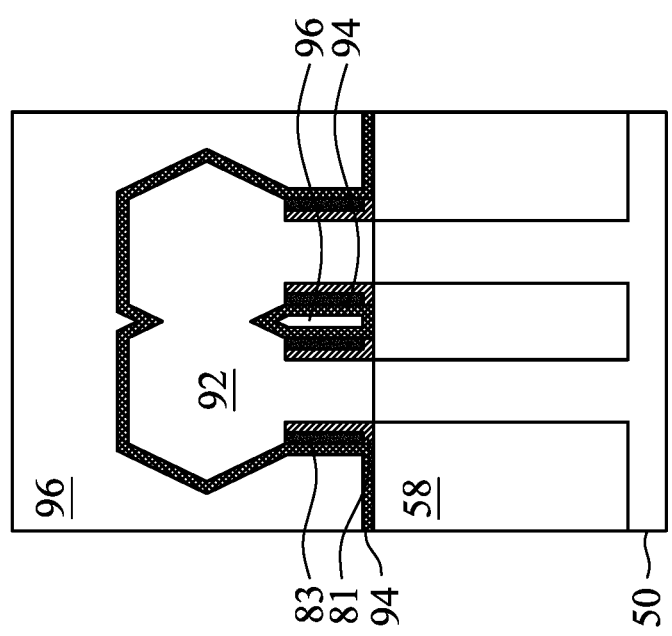

In FIGS. 18A through 18D, gate dielectric layers 100 and gate electrodes 102 are formed for replacement gates. FIG. 18D illustrates a detailed view of region 101 of FIG. 18A. The gate dielectric layers 100 are deposited conformally in the second recesses 98, such as on top surfaces and sidewalls of the substrate 50 and on top surfaces, sidewalls, and bottom surfaces of the second semiconductor layers 54A-54C. The gate dielectric layers 100 may also be deposited on top surfaces of the first ILD 96, the CESL 94, and the STI regions 58 and on top surfaces and sidewalls of the first spacers 81.

In accordance with some embodiments, the gate dielectric layers 100 comprise silicon oxide, silicon nitride, or multi-layers thereof. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The formation methods of the gate dielectric layers 100 may include molecular-beam deposition (MBD), ALD, PECVD, or the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 102 is illustrated in FIGS. 18A and 18B, the gate electrode 102 may comprise any number of liner layers 102A, any number of work function tuning layers 102B, and a fill material 102C as illustrated by FIG.

18D. After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gates of the resulting NSFETs. The gate electrodes 102 and the gate dielectric layers 100 may be collectively referred to as "gate stacks." The gate electrodes 102 may have gate lengths from about 13.0 nm to about 16.0 nm or from about 14.0 nm to about 15.0 nm.

The formation of the gate dielectric layers 100 in the region 50N and the region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials, and/or the gate electrodes 102 in each region may be formed by distinct processes, such that the gate electrodes 102 may be different materials. Various masking steps may be used to mask and expose appropriate regions when using distinct processes.

Figure 19B:
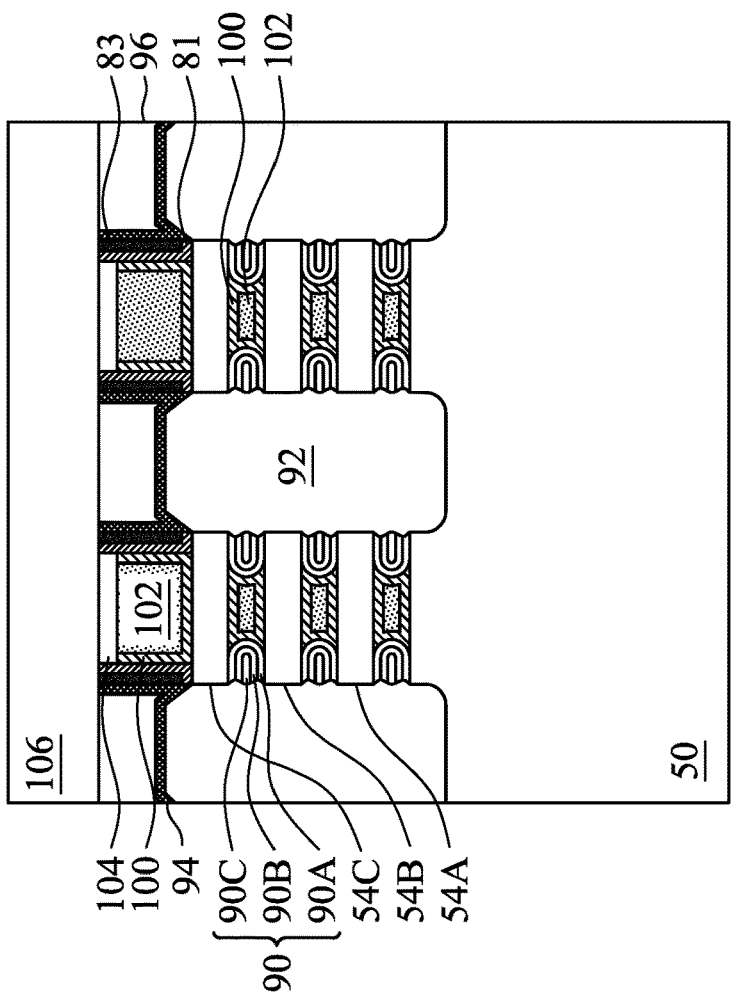
Figure 19A:
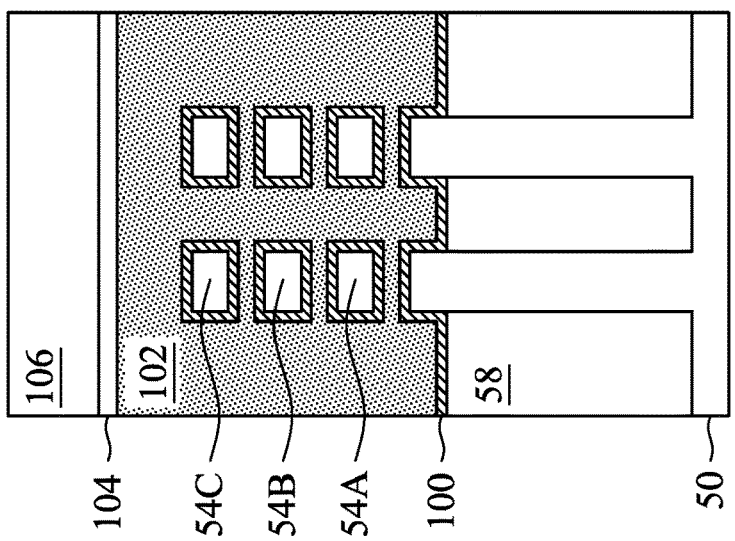
Figure 19C:
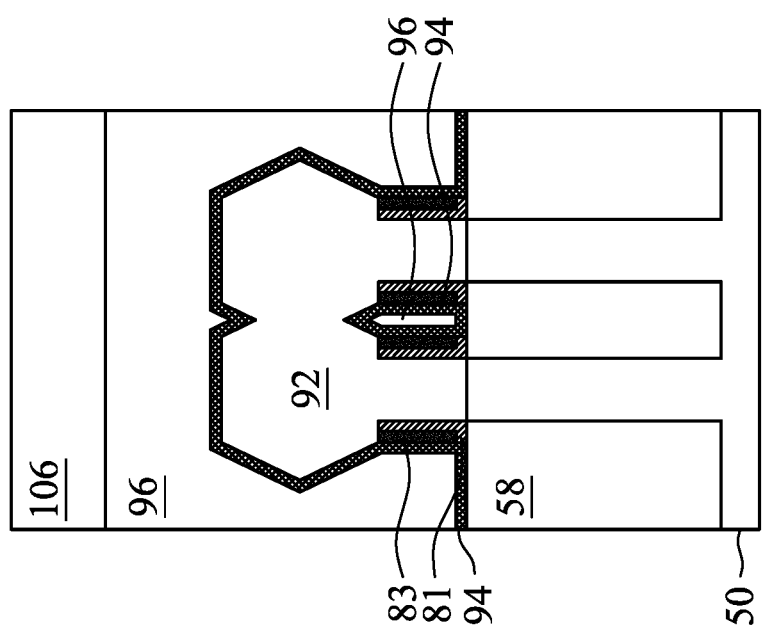

In FIGS. 19A through 19C, a second ILD 106 is deposited over the first ILD 96. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like. In some embodiments, before the formation of the second ILD 106, the gate stack (including the gate dielectric layers 100 and the corresponding overlying gate electrodes 102) is recessed, so that a recess is formed directly over the gate stack and between opposing portions of first spacers 81. A gate mask 104 including one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 112, discussed below with respect to FIGS. 20A through 20C) penetrate through the gate mask 104 to contact the top surface of the recessed gate electrodes 102.

Figure 20B:
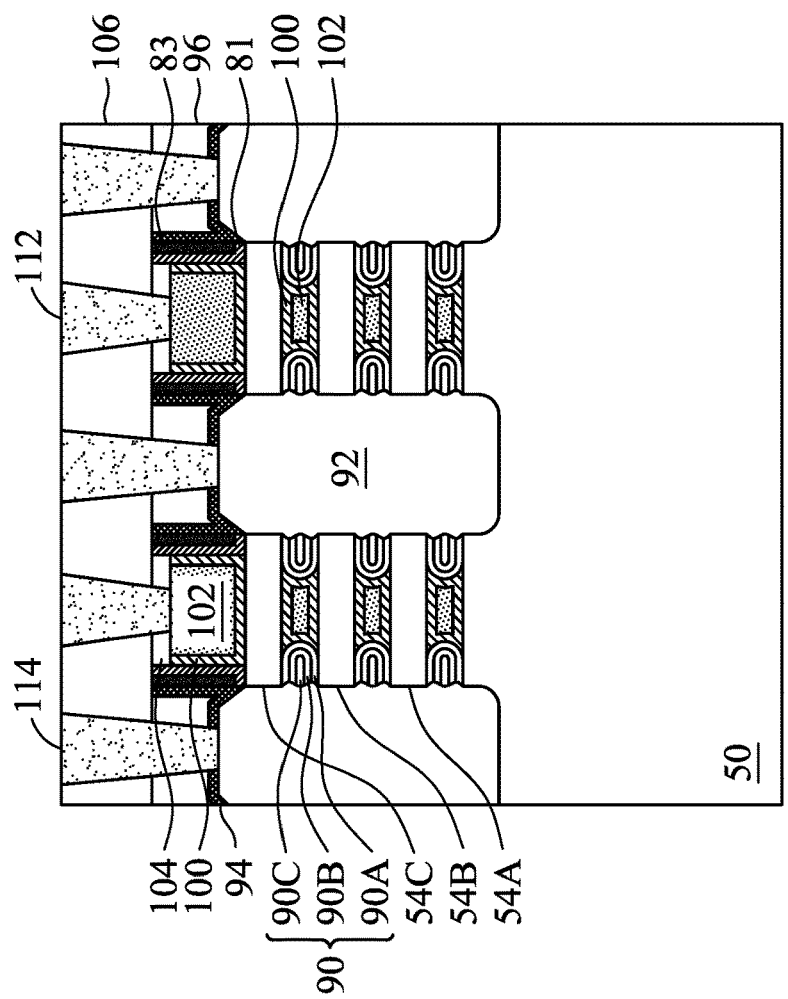
Figure 20A:
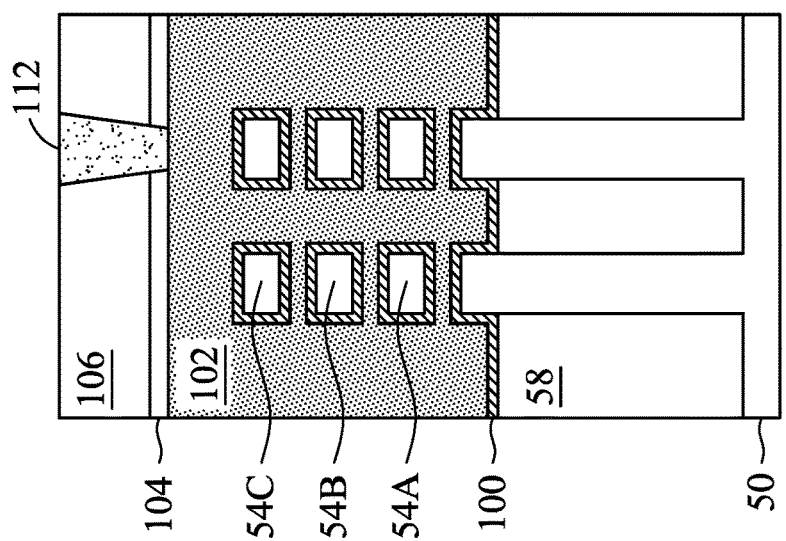
Figure 20C:
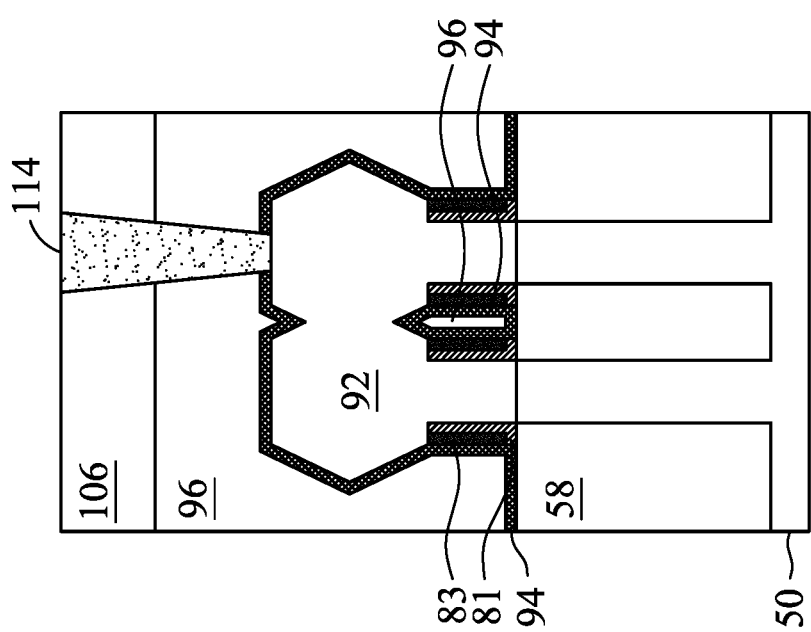

In FIGS. 20A through 20C, gate contacts 112 and source/drain contacts 114 are formed through the second ILD 106 and the first ILD 96. Openings for the source/drain contacts 114 are formed through the first ILD 96 and the second ILD 106 and openings for the gate contacts 112 are formed through the second ILD 106 and the gate mask 104. The openings may be formed using acceptable photolithography and etching techniques. One or more liners, such as a diffusion barrier layer, an adhesion layer, combinations or multiple layers thereof, or the like may be formed in the openings and a conductive material may be formed over the liner(s). The liner(s) may include titanium, titanium nitride, tantalum, tantalum nitride, combinations or multiple layers thereof, or the like. The conductive material may be copper, a copper alloy, silver, gold, tungsten, cobalt, aluminum, nickel, or the like. A planarization process, such as a CMP, may be performed to remove excess material from a surface of the second ILD 106. The remaining liner(s) and conductive material form the source/drain contacts 114 and the gate contacts 112 in the openings. An anneal process may be performed to form a silicide at the interface between the epitaxial source/drain regions 92 and the source/drain contacts 114. The source/drain contacts 114 are physically and electrically coupled to the epitaxial source/drain regions 92, and the gate contacts 112 are physically and electrically coupled to the gate electrodes 102. The source/drain contacts 114 and the gate contacts 112 may be formed in different processes, or may be formed in the same process. Although shown as being formed in the same cross-sections, it should be appreciated that each of the source/drain contacts 114 and the gate contacts 112 may be formed in different cross-sections, which may avoid shorting of the contacts.

Forming the inner spacer 90 from the first inner spacer layer 90A, the second inner spacer layer 90B, and the third inner spacer layer 90C, which are formed of different materials having different dielectric constants and etch selectivities allows for the effective k-value of the inner spacers 90 to be reduced, profiles of the inner spacers 90 to be improved, and excessive etching of the first inner spacer layer 90A, the second inner spacer layer 90B, and the third inner spacer layer 90C to be avoided. This results in NSFETs including the inner spacers 90 having reduced effective capacitance ($C_{eff}$), improved performance, and reduced device defects.

In accordance with an embodiment, a semiconductor device includes a substrate; a plurality of semiconductor channel structures over the substrate; a gate structure over the plurality of semiconductor channel structures, the gate structure extending between adjacent ones of the plurality of semiconductor channel structures; a source/drain region adjacent the gate structure, the source/drain region contacting the plurality of semiconductor channel structures; and an inner spacer interposed between the source/drain region and the gate structure, the inner spacer including a first inner spacer layer contacting the gate structure and the source/drain region, the first inner spacer layer including silicon and nitrogen; and a second inner spacer layer contacting the first inner spacer layer and the source/drain region, the second inner spacer layer including silicon, oxygen, and nitrogen, the second inner spacer layer having a lower dielectric constant than the first inner spacer layer. In an embodiment, a first sidewall of the inner spacer contacts the source/drain region, the first sidewall having a W-shape in a cross-sectional view. In an embodiment, the first inner spacer layer includes silicon carbonitride, the first inner spacer layer has an atomic percentage of carbon from 5 percent to 20 percent, and the first inner spacer layer has an atomic percentage of nitrogen from 25 percent to 45 percent. In an embodiment, the first inner spacer layer includes silicon nitride, and the first inner spacer layer has an atomic percentage of nitrogen from 35 percent to 50 percent. In an embodiment, the second inner spacer layer includes silicon oxycarbonitride, the second inner spacer layer has an atomic percentage of oxygen from 25 percent to 60 percent, the second inner spacer layer has an atomic percentage of carbon of less than 10 percent, and the second inner spacer layer has an atomic percentage of nitrogen from 10 percent to 50 percent. In an embodiment, the second inner spacer layer includes silicon oxynitride, the second inner spacer layer has an atomic percentage of oxygen from 25 percent to 60 percent, and the second inner spacer layer has an atomic percentage of nitrogen from 10 percent to 50 percent. In an embodiment, the first inner spacer layer has a dielectric constant from 6.0 to 7.3, and the second inner spacer layer has a dielectric constant from 4.2 to 6.0. In an embodiment, a ratio of a thickness of the first inner spacer layer to a thickness of the second inner spacer layer is 4.5.

In accordance with another embodiment, semiconductor device includes a semiconductor substrate; a plurality of channel regions over the semiconductor substrate; a gate structure over the plurality of channel regions, the gate structure extending between adjacent ones of the plurality of channel regions; upper spacers along sidewalls of the gate structure; a source/drain region adjacent the gate structure; and a plurality of inner spacers, each of the inner spacers being interposed between the adjacent ones of the plurality of channel regions, each of the inner spacers being interposed between the source/drain region and the gate structure, each of the inner spacers including a first inner spacer layer contacting the gate structure and the source/drain region, the first inner spacer layer including silicon and nitrogen; a second inner spacer layer contacting the first inner spacer layer and the source/drain region, the second inner spacer layer including silicon, oxygen, and nitrogen, the second inner spacer layer having a lower dielectric constant than the first inner spacer layer; and a third inner spacer layer contacting the second inner spacer layer and the source/drain region, the third inner spacer layer including silicon and nitrogen, sidewalls of the inner spacers adjacent the source/drain region being W-shaped in a cross-sectional view. In an embodiment, the third inner spacer layer includes silicon, nitrogen, and oxygen, and an atomic percentage of oxygen in the second inner spacer layer is greater than an atomic percentage of oxygen in the third inner spacer layer. In an embodiment, the first inner spacer layer, the second inner spacer layer, and the third inner spacer layer include carbon, and an atomic percentage of carbon in the first inner spacer layer is greater than an atomic percentage of carbon in the second inner spacer layer and the third inner spacer layer. In an embodiment, a thickness of the inner spacers measured between the source/drain region and the gate structure is greater than 3 nm. In an embodiment, sidewalls of the inner spacers are recessed from sidewalls of the plurality of channel regions less than 10 Å. In an embodiment, a dielectric constant of the first inner spacer layer is from 6.0 to 7.3, a dielectric constant of the second inner spacer layer is from 4.2 to 5.7, and a dielectric constant of the third inner spacer layer is from 4.5 to 6.0.

In accordance with yet another embodiment, a method includes forming a multi-layer stack over a semiconductor substrate, the multi-layer stack including alternating layers of a first semiconductor material and a second semiconductor material different from the first semiconductor material; etching sidewalls of the first semiconductor material to form sidewall recesses; depositing a first inner spacer layer over the multi-layer stack and in the sidewall recesses; depositing a second inner spacer layer over the first inner spacer layer; depositing a third inner spacer layer filling the sidewall recesses; performing a first etch process to etch the first inner spacer layer, the second inner spacer layer, and the third inner spacer layer and form inner spacers including remaining portions of the first inner spacer layer, the second inner spacer layer, and the third inner spacer layer in the sidewall recesses, the first etch process etching the second inner spacer layer at an etching rate greater than an etching rate of the third inner spacer layer; performing a second etch process to remove the first semiconductor material and form first recesses extending between the inner spacers, the second etch process etching the first inner spacer layer at an etching rate less than an etching rate of the first semiconductor material; and forming gate structures in the first recesses. In an embodiment, the first inner spacer layer, the second inner spacer layer, and the third inner spacer layer are deposited in situ. In an embodiment, the first inner spacer layer, the second inner spacer layer, and the third inner spacer layer are deposited at a temperature from 500° C. to 680° C. In an embodiment, a ratio of the etching rate of the first semiconductor material to the etching rate of the first inner spacer layer during the second etch process is from 50 to 500. In an embodiment, a ratio of the etching rate of the second inner spacer layer to the etching rate of the third inner spacer layer during the first etch process is from 1.2 to 3.0. In an embodiment, a ratio of an etching rate of the second inner spacer layer to the etching rate of the first inner spacer layer during the first etch process is from 1.2 to 3.0.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a substrate;
    a plurality of semiconductor channel structures over the substrate;
    a gate structure over the plurality of semiconductor channel structures, wherein the gate structure extends between adjacent ones of the plurality of semiconductor channel structures;
    a source/drain region adjacent the gate structure, the source/drain region contacting the plurality of semiconductor channel structures; and
    an inner spacer interposed between the source/drain region and the gate structure, the inner spacer comprising:
        a first inner spacer layer contacting the gate structure and the source/drain region, the first inner spacer layer comprising silicon and nitrogen;
        a second inner spacer layer contacting the first inner spacer layer and the source/drain region, the second inner spacer layer comprising silicon, oxygen, and nitrogen, the second inner spacer layer having a lower dielectric constant than the first inner spacer layer; and
        a third inner spacer layer contacting the second inner spacer layer and the source/drain region, wherein the first inner spacer layer, the second inner spacer layer, and the third inner spacer layer comprise carbon, and wherein an atomic percentage of carbon in the first inner spacer layer is greater than an atomic percentage of carbon in the second inner spacer layer and the third inner spacer layer.

2. The semiconductor device of claim 1, wherein a first sidewall of the inner spacer contacts the source/drain region, the first sidewall having a W-shape in a cross-sectional view.

3. The semiconductor device of claim 1, wherein the first inner spacer layer comprises silicon carbonitride, wherein the first inner spacer layer has an atomic percentage of carbon from 5 percent to 20 percent, and wherein the first inner spacer layer has an atomic percentage of nitrogen from 25 percent to 45 percent.

4. The semiconductor device of claim 1, wherein the first inner spacer layer comprises silicon nitride, and wherein the first inner spacer layer has an atomic percentage of nitrogen from 35 percent to 50 percent.

5. The semiconductor device of claim 1, wherein the second inner spacer layer comprises silicon oxycarbonitride, wherein the second inner spacer layer has an atomic percentage of oxygen from 25 percent to 60 percent, wherein the second inner spacer layer has an atomic percentage of carbon of less than 10 percent, and wherein the second inner spacer layer has an atomic percentage of nitrogen from 10 percent to 50 percent.

6. The semiconductor device of claim 1, wherein the second inner spacer layer comprises silicon oxynitride, wherein the second inner spacer layer has an atomic percentage of oxygen from 25 percent to 60 percent, and wherein the second inner spacer layer has an atomic percentage of nitrogen from 10 percent to 50 percent.

7. The semiconductor device of claim 1, wherein the first inner spacer layer has a dielectric constant from 6.0 to 7.3, and wherein the second inner spacer layer has a dielectric constant from 4.2 to 6.0.

8. The semiconductor device of claim 1, wherein a ratio of a thickness of the first inner spacer layer to a thickness of the second inner spacer layer is 4.5.

9. A semiconductor device comprising:
a semiconductor substrate;
a plurality of channel regions over the semiconductor substrate;
a gate structure over the plurality of channel regions, wherein the gate structure extends between adjacent ones of the plurality of channel regions;
upper spacers along sidewalls of the gate structure;
a source/drain region adjacent the gate structure; and
a plurality of inner spacers, each of the inner spacers being interposed between the adjacent ones of the plurality of channel regions, each of the inner spacers being interposed between the source/drain region and the gate structure, each of the inner spacers comprising:
a first inner spacer layer contacting the gate structure and the source/drain region, the first inner spacer layer comprising silicon and nitrogen;
a second inner spacer layer contacting the first inner spacer layer and the source/drain region, the second inner spacer layer comprising silicon, oxygen, and nitrogen, the second inner spacer layer having a lower dielectric constant than the first inner spacer layer; and
a third inner spacer layer contacting the second inner spacer layer and the source/drain region, the third inner spacer layer comprising silicon and nitrogen, wherein sidewalls of the inner spacers adjacent the source/drain region are W-shaped in a cross-sectional view, wherein the first inner spacer layer, the second inner spacer layer, and the third inner spacer layer comprise carbon, and wherein an atomic percentage of carbon in the first inner spacer layer is greater than an atomic percentage of carbon in the second inner spacer layer and the third inner spacer layer.

10. The semiconductor device of claim 9, wherein the third inner spacer layer comprises silicon, nitrogen, and oxygen, and wherein an atomic percentage of oxygen in the second inner spacer layer is greater than an atomic percentage of oxygen in the third inner spacer layer.

11. The semiconductor device of claim 9, wherein a thickness of the inner spacers measured between the source/drain region and the gate structure is greater than 3 nm.

12. The semiconductor device of claim 9, wherein sidewalls of the inner spacers are recessed from sidewalls of the plurality of channel regions less than 10 Å.

13. The semiconductor device of claim 9, wherein a dielectric constant of the first inner spacer layer is from 6.0 to 7.3, wherein a dielectric constant of the second inner spacer layer is from 4.2 to 5.7, and wherein a dielectric constant of the third inner spacer layer is from 4.5 to 6.0.

14. The semiconductor device of claim 9, wherein an atomic percentage of carbon in the first inner spacer layer is from 10 percent to 15 percent, wherein an atomic percentage of carbon in the second inner spacer layer is from 0 percent to 5 percent, and wherein an atomic percentage of carbon in the third inner spacer layer is from 3 percent to 10 percent.

15. A method comprising:
forming a multi-layer stack over a semiconductor substrate, the multi-layer stack comprising alternating layers of a first semiconductor material and a second semiconductor material different from the first semiconductor material;
etching sidewalls of the first semiconductor material to form sidewall recesses;
depositing a first inner spacer layer over the multi-layer stack and in the sidewall recesses;
depositing a second inner spacer layer over the first inner spacer layer;
depositing a third inner spacer layer filling the sidewall recesses;
performing a first etch process to etch the first inner spacer layer, the second inner spacer layer, and the third inner spacer layer and form inner spacers comprising remaining portions of the first inner spacer layer, the second inner spacer layer, and the third inner spacer layer in the sidewall recesses, wherein the first etch process etches the second inner spacer layer at an etching rate greater than an etching rate of the third inner spacer layer;
performing a second etch process to remove the first semiconductor material and form first recesses extending between the inner spacers, wherein the second etch process etches the first inner spacer layer at an etching rate less than an etching rate of the first semiconductor material; and
forming gate structures in the first recesses.

16. The method of claim 15, wherein the first inner spacer layer, the second inner spacer layer, and the third inner spacer layer are deposited in situ.

17. The method of claim 15, wherein the first inner spacer layer, the second inner spacer layer, and the third inner spacer layer are deposited at a temperature from 500° C. to 680° C.

18. The method of claim 15, wherein a ratio of the etching rate of the first semiconductor material to the etching rate of the first inner spacer layer during the second etch process is from 50 to 500.

19. The method of claim 15, wherein a ratio of the etching rate of the second inner spacer layer to the etching rate of the third inner spacer layer during the first etch process is from 1.2 to 3.0.

20. The method of claim 19, wherein a ratio of an etching rate of the second inner spacer layer to the etching rate of the first inner spacer layer during the first etch process is from 1.2 to 3.0.

* * * * *